US009859363B2

(12) United States Patent
Lu et al.

(10) Patent No.: US 9,859,363 B2
(45) Date of Patent: Jan. 2, 2018

(54) SELF-ALIGNED ISOLATION DIELECTRIC STRUCTURES FOR A THREE-DIMENSIONAL MEMORY DEVICE

(71) Applicant: SANDISK TECHNOLOGIES, LLC., Plano, TX (US)

(72) Inventors: Zhenyu Lu, Milpitas, CA (US); Kota Funayama, Yokkaichi (JP); Chun-Ming Wang, Fremont, CA (US); Jixin Yu, Milpitas, CA (US); Chenche Huang, Campbell, CA (US); Tong Zhang, Palo Alto, CA (US); Daxin Mao, Cupertino, CA (US); Johann Alsmeier, San Jose, CA (US); Makoto Yoshida, Yokkaichi (JP); Lauren Matsumoto, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/155,639

(22) Filed: May 16, 2016

(65) Prior Publication Data

US 2017/0236896 A1 Aug. 17, 2017

Related U.S. Application Data

(60) Provisional application No. 62/295,682, filed on Feb. 16, 2016.

(51) Int. Cl.
*H01L 29/06* (2006.01)
*H01L 21/76* (2006.01)
(Continued)

(52) U.S. Cl.
CPC ...... *H01L 29/0649* (2013.01); *H01L 27/1128* (2013.01); *H01L 27/1157* (2013.01);
(Continued)

(58) Field of Classification Search
CPC ........... H01L 29/0649; H01L 27/11524; H01L 27/11556; H01L 27/1157; H01L 27/11582; H01L 27/1128; H01L 27/2481
See application file for complete search history.

(56) References Cited

U.S. PATENT DOCUMENTS 5,915,167 A * 6/1999 Leedy .................. G11C 5/02
257/E21.597
9,412,749 B1 * 8/2016 Shimabukuro ... H01L 27/11582
(Continued)

FOREIGN PATENT DOCUMENTS

WO WO 2016200742 A1 * 12/2016 ........ H01L 27/11524

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Earl Taylor
(74) *Attorney, Agent, or Firm* — The Marbury Law Group PLLC

(57) ABSTRACT

A method of dividing drain select gate electrodes in a three-dimensional vertical memory device is provided. An alternating stack of insulating layers and spacer material layers is formed over a substrate. A first insulating cap layer is formed over the alternating stack. A plurality of memory stack structures is formed through the alternating stack and the first insulating cap layer. The first insulating cap layer is vertically recessed, and a conformal material layer is formed over protruding portions of the memory stack structures. Spacer portions are formed by an anisotropic etch of the conformal material layer such that the sidewalls of the spacer portions having protruding portions. A self-aligned separator trench with non-uniform sidewalls having protruding portions is formed through an upper portion of the
(Continued)

alternating stack by etching the upper portions of the alternating stack between the spacer portions.

31 Claims, 30 Drawing Sheets

(51) Int. Cl.
<table>
<tr><td>H01L 27/11524</td><td>(2017.01)</td></tr>
<tr><td>H01L 27/11556</td><td>(2017.01)</td></tr>
<tr><td>H01L 27/1157</td><td>(2017.01)</td></tr>
<tr><td>H01L 27/11582</td><td>(2017.01)</td></tr>
<tr><td>H01L 27/24</td><td>(2006.01)</td></tr>
<tr><td>H01L 27/112</td><td>(2006.01)</td></tr>
</table>

(52) U.S. Cl.
CPC .. *H01L 27/11524* (2013.01); *H01L 27/11556* (2013.01); *H01L 27/11582* (2013.01); *H01L 27/2481* (2013.01)

(56) References Cited

U.S. PATENT DOCUMENTS

<table>
<tr><td>9,443,868 B1*</td><td>9/2016</td><td>Hu</td><td>H01L 27/11582</td></tr>
<tr><td>9,455,267 B2*</td><td>9/2016</td><td>Zhang</td><td>H01L 23/528</td></tr>
<tr><td>9,553,100 B2*</td><td>1/2017</td><td>Kamiya</td><td>H01L 21/0206</td></tr>
<tr><td>9,679,906 B2*</td><td>6/2017</td><td>Lu</td><td>H01L 27/11519</td></tr>
<tr><td>2012/0001249 A1*</td><td>1/2012</td><td>Alsmeier</td><td>H01L 27/11551<br>257/319</td></tr>
<tr><td>2013/0248974 A1*</td><td>9/2013</td><td>Alsmeier</td><td>G11C 16/04<br>257/321</td></tr>
<tr><td>2014/0014889 A1*</td><td>1/2014</td><td>Shim</td><td>H01L 29/7827<br>257/1</td></tr>
<tr><td>2014/0175534 A1*</td><td>6/2014</td><td>Kofuji</td><td>H01L 27/11575<br>257/324</td></tr>
<tr><td>2014/0191388 A1*</td><td>7/2014</td><td>Chen</td><td>H01L 27/11548<br>257/734</td></tr>
<tr><td>2016/0049421 A1*</td><td>2/2016</td><td>Zhang</td><td>H01L 27/11582<br>257/314</td></tr>
<tr><td>2016/0079185 A1*</td><td>3/2016</td><td>Kato</td><td>H01L 21/76877<br>257/314</td></tr>
<tr><td>2016/0086969 A1*</td><td>3/2016</td><td>Zhang</td><td>H01L 23/528<br>257/314</td></tr>
<tr><td>2017/0047334 A1*</td><td>2/2017</td><td>Lu</td><td>H01L 27/11519</td></tr>
<tr><td>2017/0069655 A1*</td><td>3/2017</td><td>Ichinose</td><td>H01L 27/11582</td></tr>
<tr><td>2017/0236896 A1*</td><td>8/2017</td><td>Lu</td><td>H01L 29/0649</td></tr>
</table>

OTHER PUBLICATIONS

Invitation to Pay Additional Fees, and Communication Relating to the Results of the Partial International Search for International Application No. PCT/US2016/036326, dated Aug. 11, 2016, 7 Pages.
The International Search Report and Written Opinion of the International Searching Authority for International Application No. PCT/US2016/036326, dated Oct. 6, 2016, 16 Pages.
Invitation to Pay Additional Fees for PCT/US2015/047932, dated Dec. 23, 2015, 9 pages.
International Search Report and Written Opinion for PCT/US2015/047932, dated Mar. 2, 2016, 22 pages.
U.S. Appl. No. 14/491,026, filed Sep. 19, 2014, SanDisk Technologies Inc.
U.S. Appl. No. 14/462,209, filed Aug. 18, 2014, SanDisk Technologies Inc.
U.S. Appl. No. 14/491,315, filed Sep. 19, 2014, SanDisk Technologies Inc.
U.S. Appl. No. 14/823,274, filed Aug. 11, 2015, SanDisk Technologies Inc.

* cited by examiner

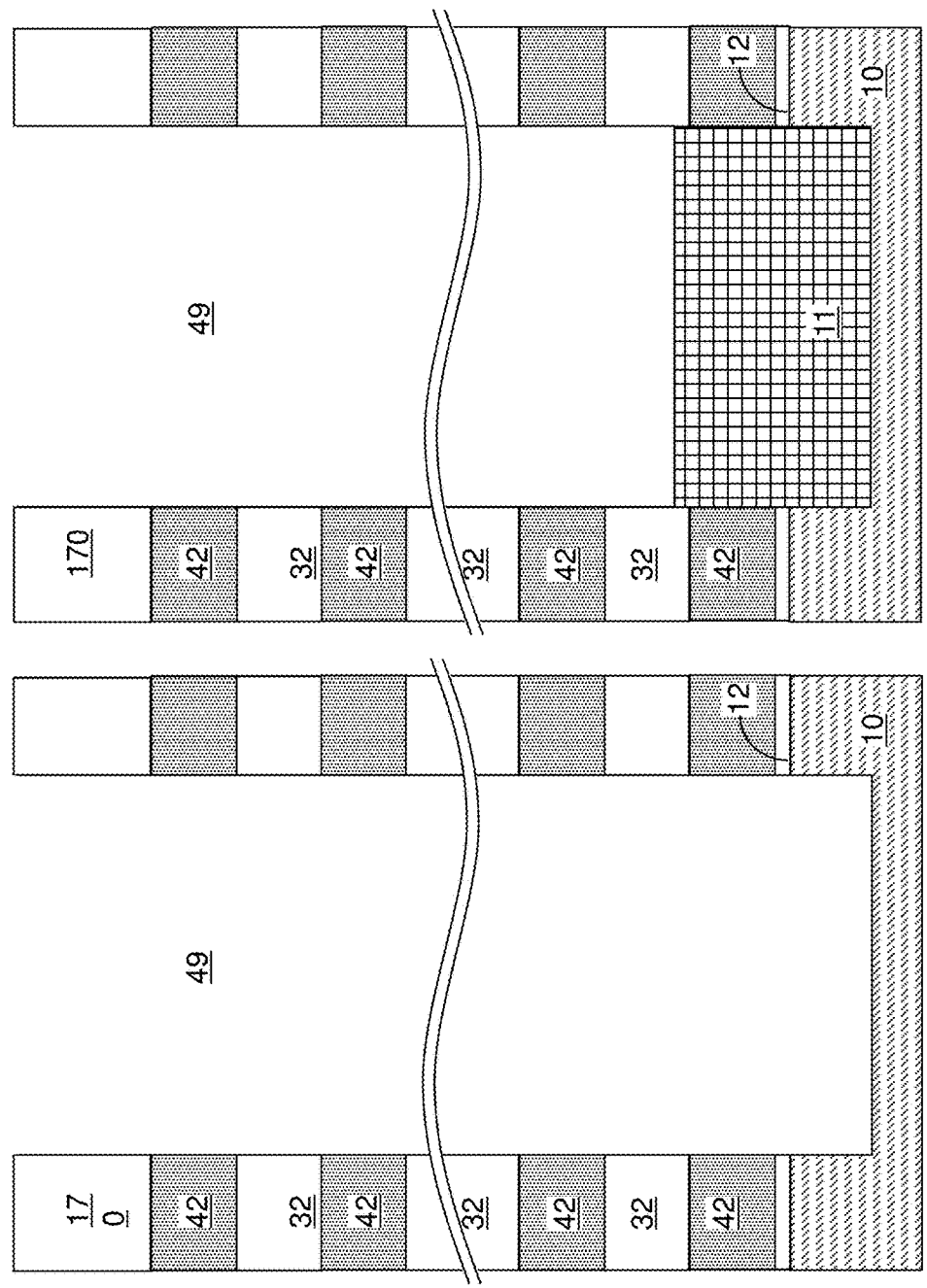

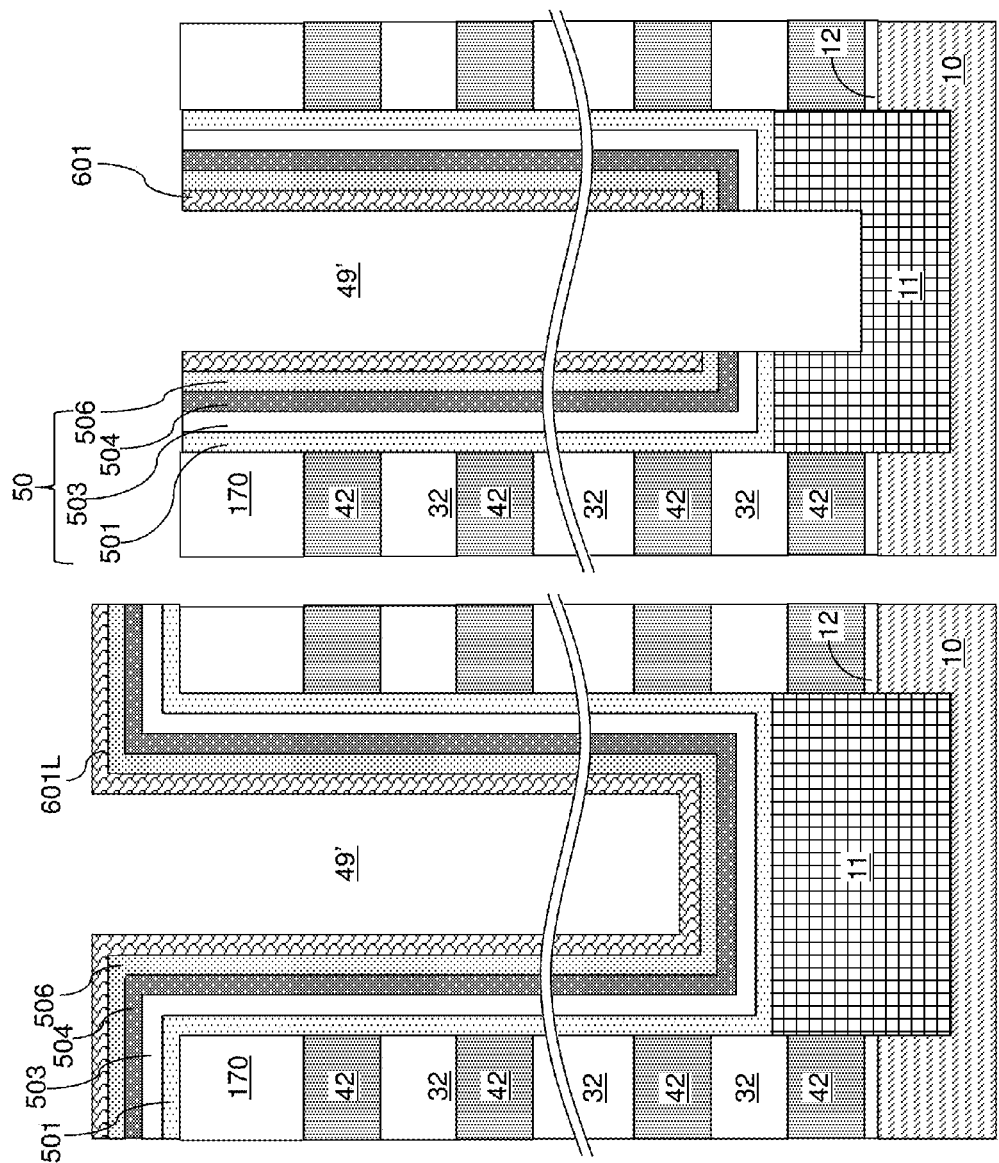

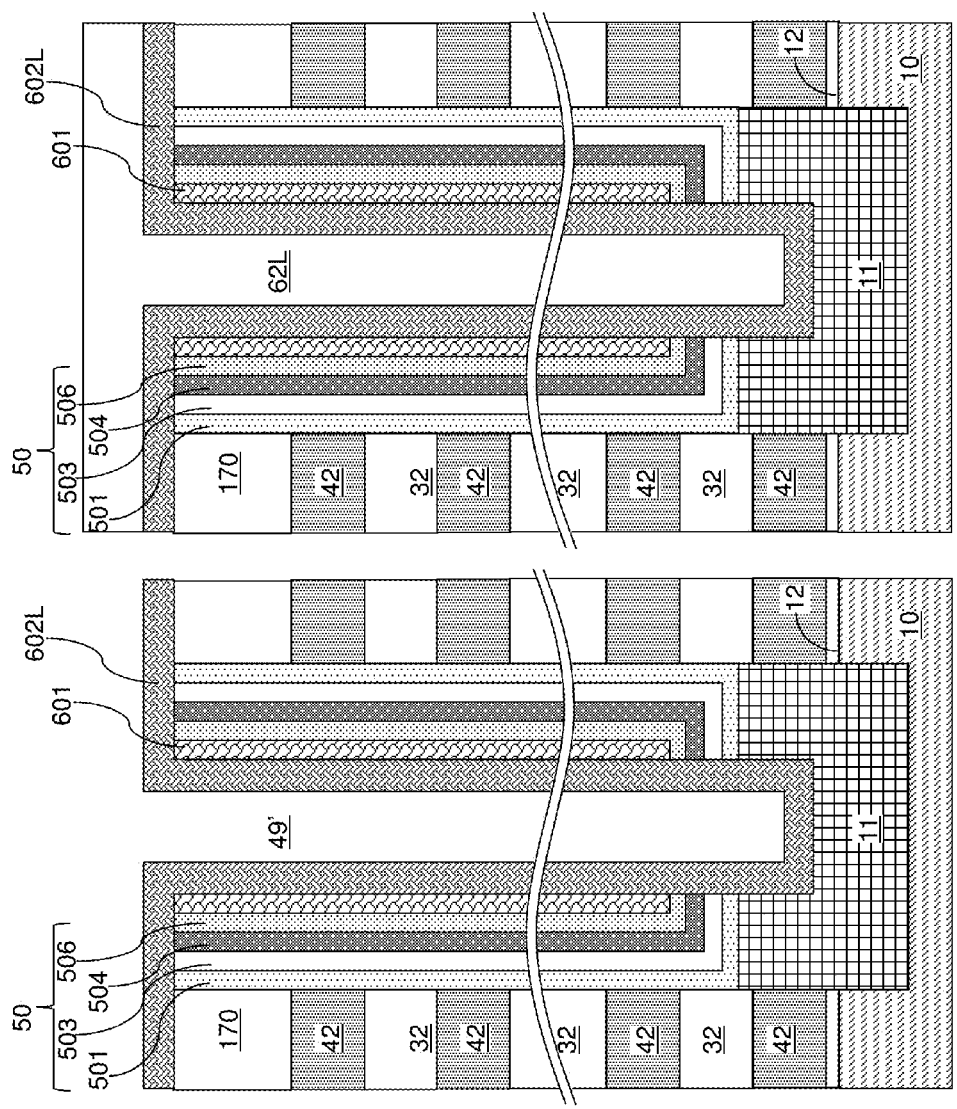

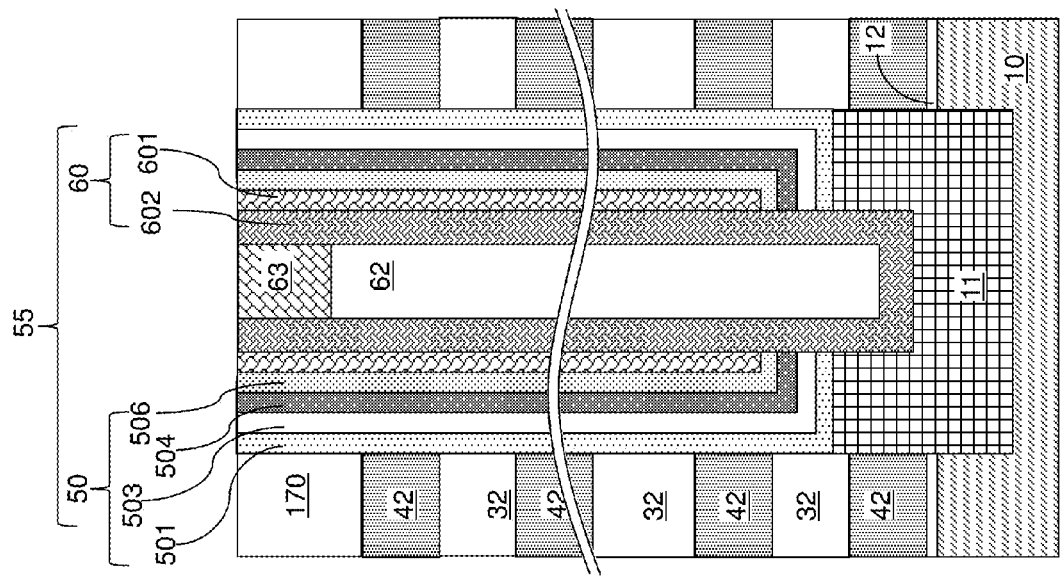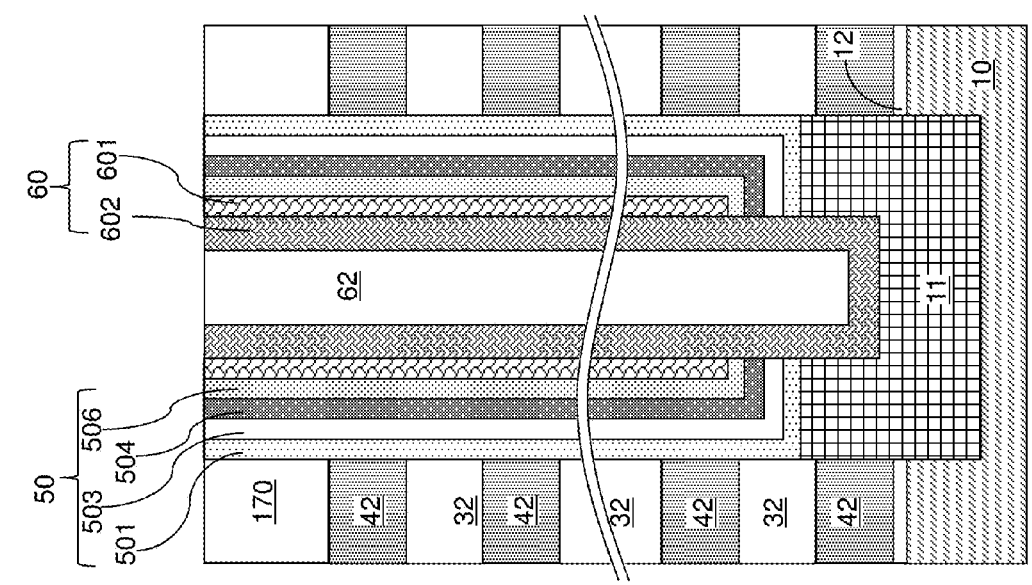

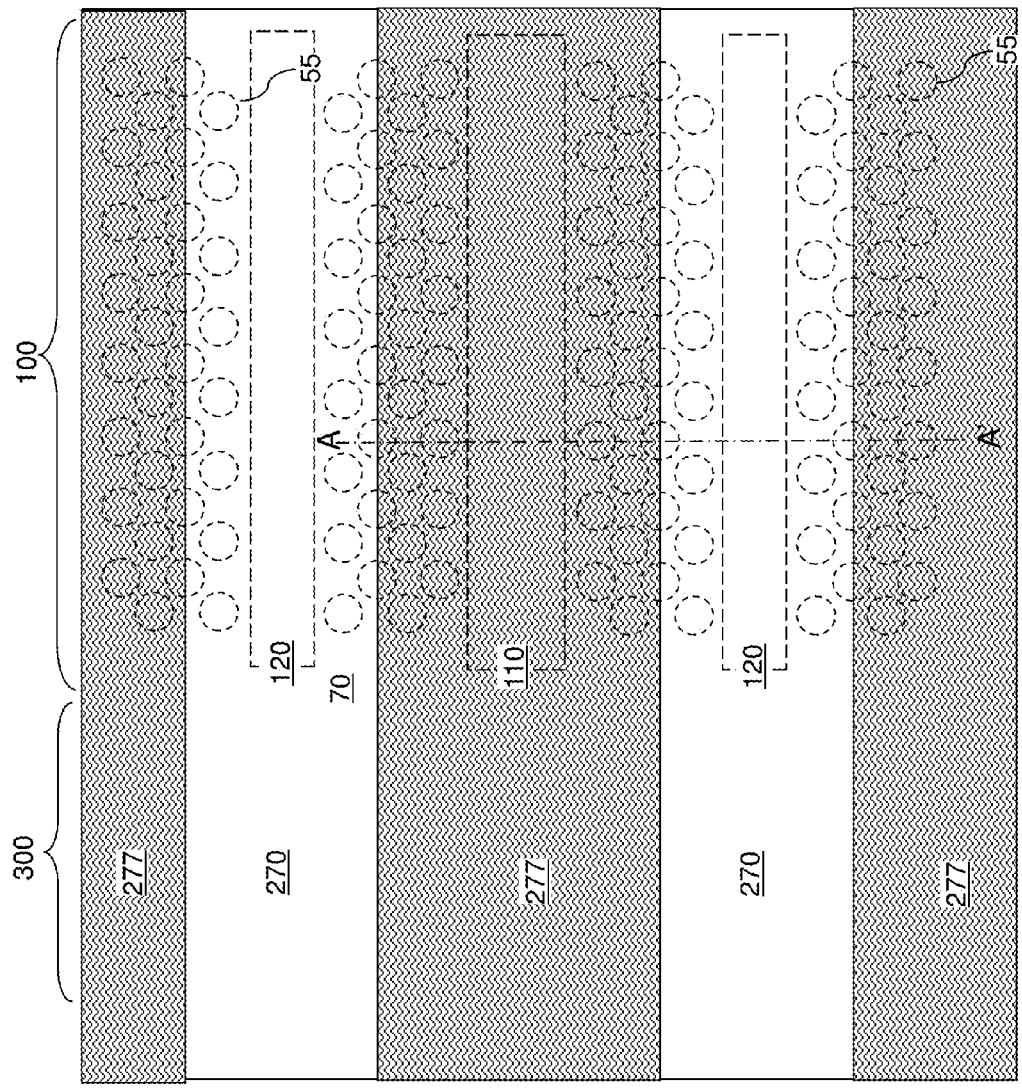

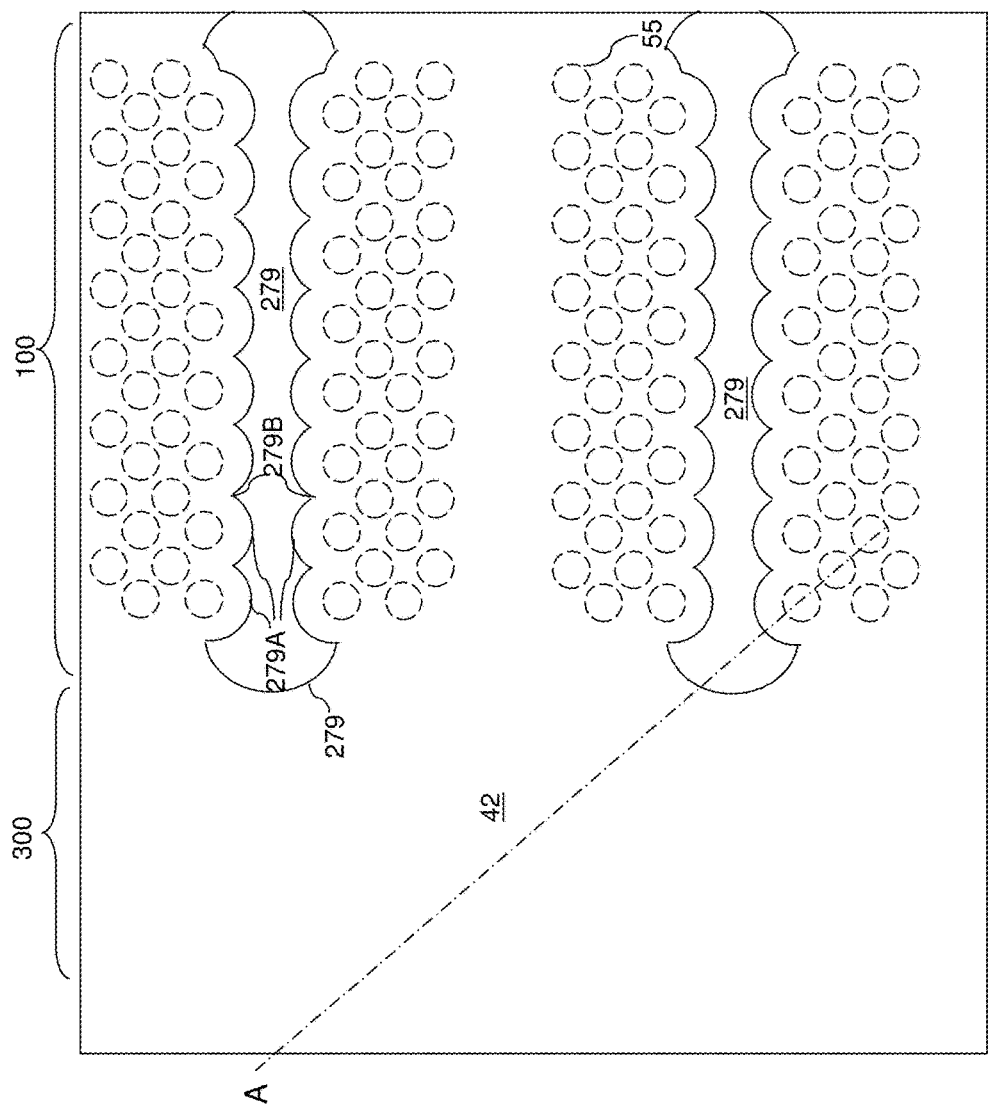

SELF-ALIGNED ISOLATION DIELECTRIC STRUCTURES FOR A THREE-DIMENSIONAL MEMORY DEVICE

FIELD

The present disclosure relates generally to the field of semiconductor devices and specifically to three-dimensional semiconductor devices, such as vertical NAND strings, and methods of making thereof.

BACKGROUND

Monolithic three-dimensional vertical NAND devices having a vertical channel are disclosed in U.S. Pat. No. 8,349,681, which is incorporated herein by reference in its entirety.

SUMMARY

According to an aspect of the present disclosure, a monolithic three-dimensional memory device is provided, which comprises: an alternating stack of insulating layers and electrically conductive layers located over a substrate; a plurality of memory stack structures extending through the alternating stack; a separator trench extending through an upper portion of the alternating stack and including non-planar sidewalls having protruding portions; and a dielectric material layer filling the separator trench and overlying the alternating stack. The separator trench extends through a first subset of the electrically conductive layers, and does not extend into a second subset of the electrically conductive layers that underlie the first subset of the electrically conductive layers.

According to another aspect of the present disclosure, a method of forming a monolithic three-dimensional memory device is provided. An alternating stack of insulating layers and spacer material layers is formed over a substrate. A plurality of memory stack structures is formed through the alternating stack. A separator trench is formed through an upper portion of the alternating stack. The separator trench includes non-planar sidewalls having protruding portions. The separator trench extends through a first subset of the electrically conductive layers, and does not extend into a second subset of the electrically conductive layers that underlie the first subset of the electrically conductive layers. A dielectric material layer filling the separator trench and overlying the alternating stack is formed.

BRIEF DESCRIPTION OF THE DRAWINGS

FIGS. 4A-4H are sequential vertical cross-sectional views of a memory opening within the first exemplary structure during various processing steps employed to form a memory stack structure according to the first embodiment of the present disclosure.

FIG. 9B is a top-down view of the first exemplary structure of FIG. 9A according to the first embodiment of the present disclosure. The vertical plane A-A' corresponds to the plane of the vertical cross-sectional view of FIG. 9A.

FIG. 20B is a top-down view of the second exemplary structure of FIG. 20A.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
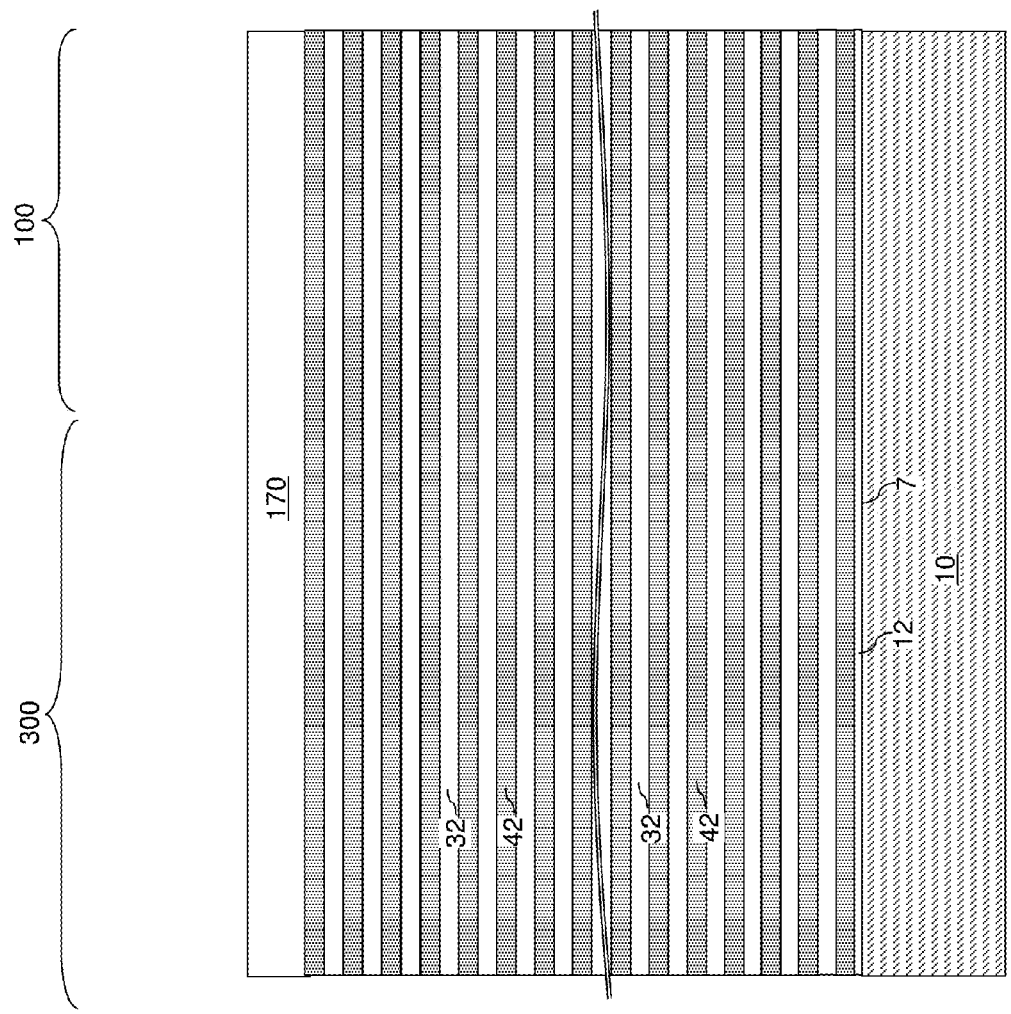
FIG. 1 is a vertical cross-sectional view of a first exemplary structure after formation of a stack including an alternating plurality of first and second material layers and a first insulating cap layer according to a first embodiment of the present disclosure.

Referring to FIG. 1, an exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 10. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10.

At least one semiconductor device for a peripheral circuitry (not shown) can be formed on a portion of the substrate semiconductor layer 10. The at least one semiconductor device can include, for example, field effect transistors. For example, at least one shallow trench isolation structure (not shown) can be formed by etching portions of the substrate semiconductor layer 10 and depositing a dielectric material therein. Additional device components (not shown), such as a gate dielectric layer, at least one gate conductor layer, and a gate cap dielectric layer, can be formed over the substrate semiconductor layer 10, and can be subsequently patterned to form at least one gate structure (not shown), each of which can include, for example, a gate dielectric, at least one gate electrode, and a gate cap dielectric. At least one gate spacer (not shown) can be formed around the at least one gate structure by depositing and anisotropically etching a conformal dielectric layer. Active regions (such as source regions and drain regions) can be formed in upper portions of the substrate semiconductor layer 10, for example, by introducing electrical dopants employing the at least one gate structure as masking structures. Additional masks may be employed as needed. The least one semiconductor device for the peripheral circuitry can contain a driver circuit for memory devices to be subsequently formed, which can include at least one NAND device. The portion of the substrate semiconductor layer 10 on which the semiconductor devices of the peripheral circuitry are formed may, or may not, be recessed with respect to the top surface of the substrate semiconductor layer 10. Further, formation of the semiconductor devices of the peripheral circuitry may be performed after formation of memory stack structures in a subsequent step, and may employ a raised epitaxial pedestal that can be formed over a top surface of the substrate semiconductor layer 10. Optionally, a planarization dielectric layer (not shown) may be employed to provide a planar surface after formation of the semiconductor devices.

A doped well (not expressly shown) can be formed in a portion of the substrate semiconductor layer 10 in the device region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 10 or can be a portion of the substrate semiconductor layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Optionally, a gate dielectric layer 12 can be formed above the substrate semiconductor layer 10. The gate dielectric layer 12 can be employed as the gate dielectric for a source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

A stack of an alternating plurality of first material layers (which can be insulating layers 32) and second material layers (which are referred to as spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality. The spacer material layers can be formed as electrically conductive layers, or can be replaced with electrically conductive layers in a subsequent processing step.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, a first insulating cap layer 170 can be formed over the alternating stack (32, 42). The first insulating cap layer 170 includes a dielectric material that is different from the material of the sacrificial material layers 42. In one embodiment, the first insulating cap layer 170 can include a dielectric material that can be employed for the insulating layers 32 as described above. The first insulating cap layer 170 can have a greater thickness than each of the insulating layers 32. The first insulating cap layer 170 can be deposited, for example, by chemical vapor deposition. In one embodiment, the first insulating cap layer 170 can be a silicon oxide layer. The thickness of the first insulating layer 170 can be in a range from 150 nm to 500 nm, although lesser and greater thicknesses can also be employed.

Figure 2:
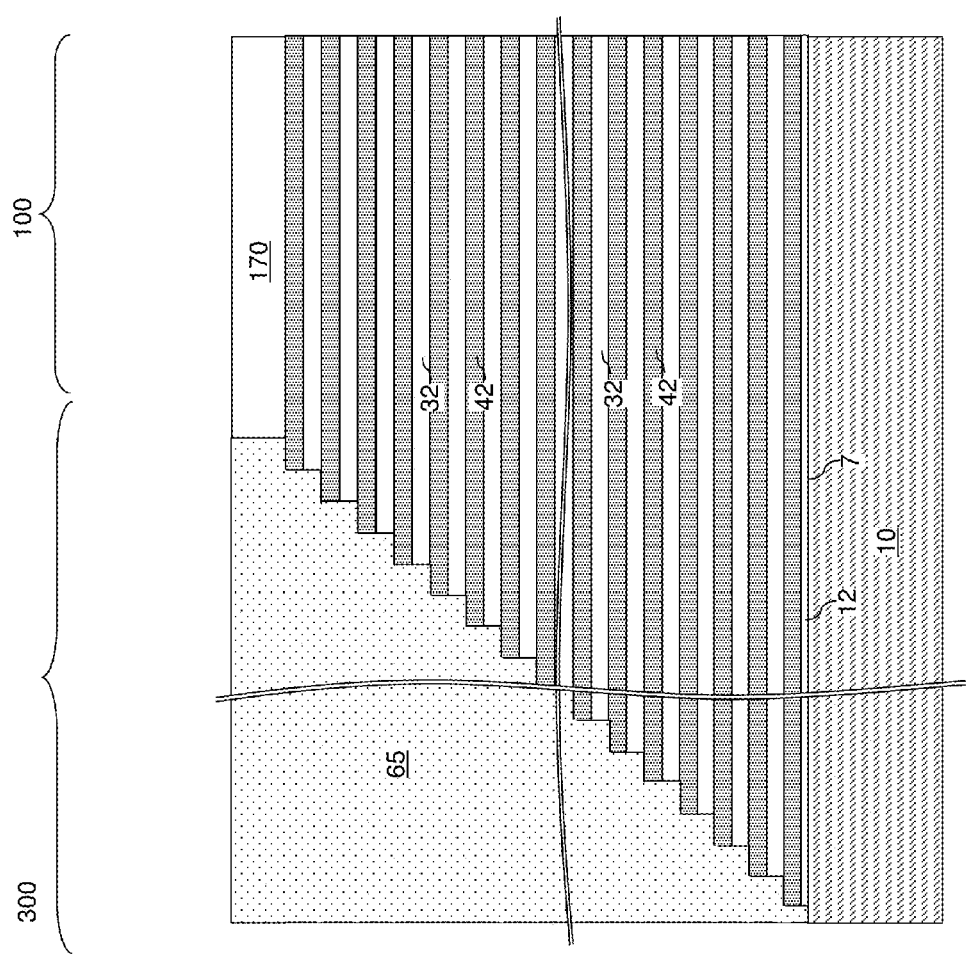
FIG. 2 is a vertical cross-sectional view of the first exemplary structure after formation of stepped surfaces and a retro-stepped dielectric material portion according to the first embodiment of the present disclosure.

Referring to FIG. 2, a stepped cavity can be formed within a contact region 300. The stepped cavity can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

A remaining peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first insulating cap layer 170, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 3A:
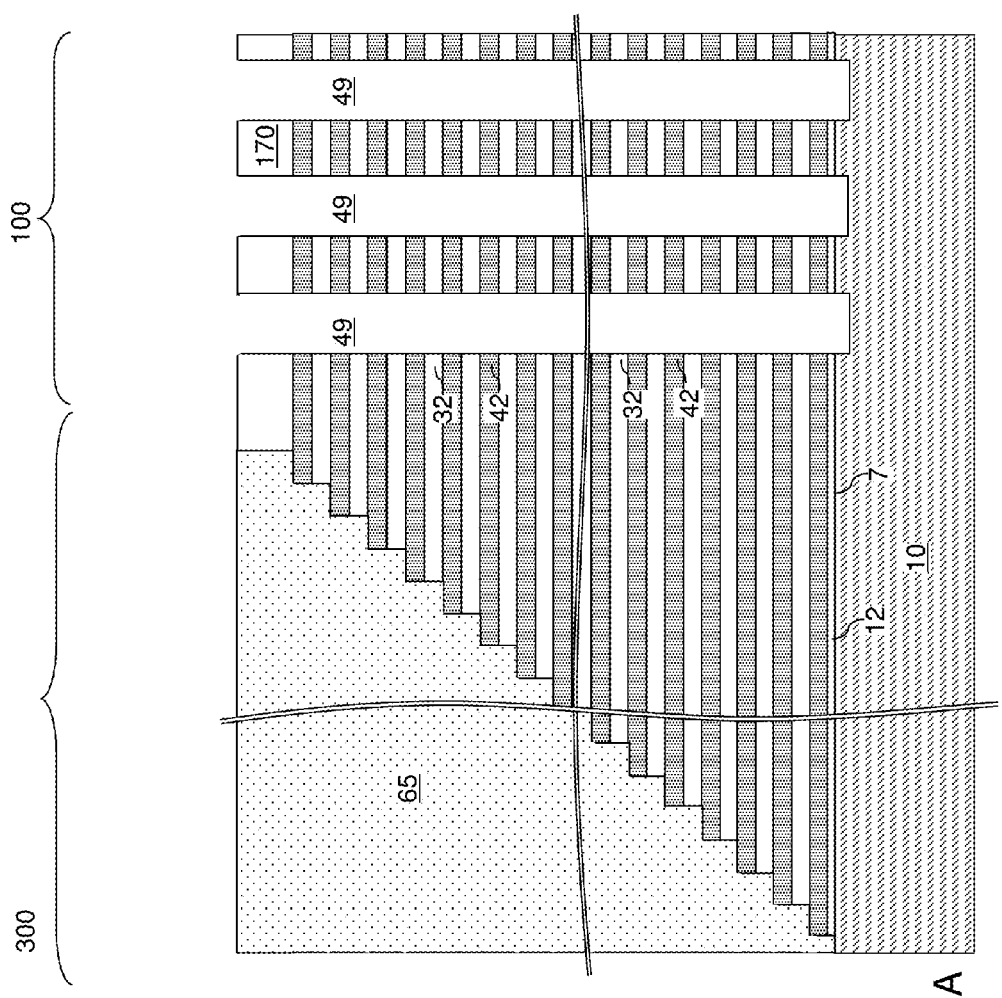
FIG. 3A is a vertical cross-sectional view of the first exemplary structure after formation of memory openings according the first embodiment of the present disclosure.
Figure 3B:
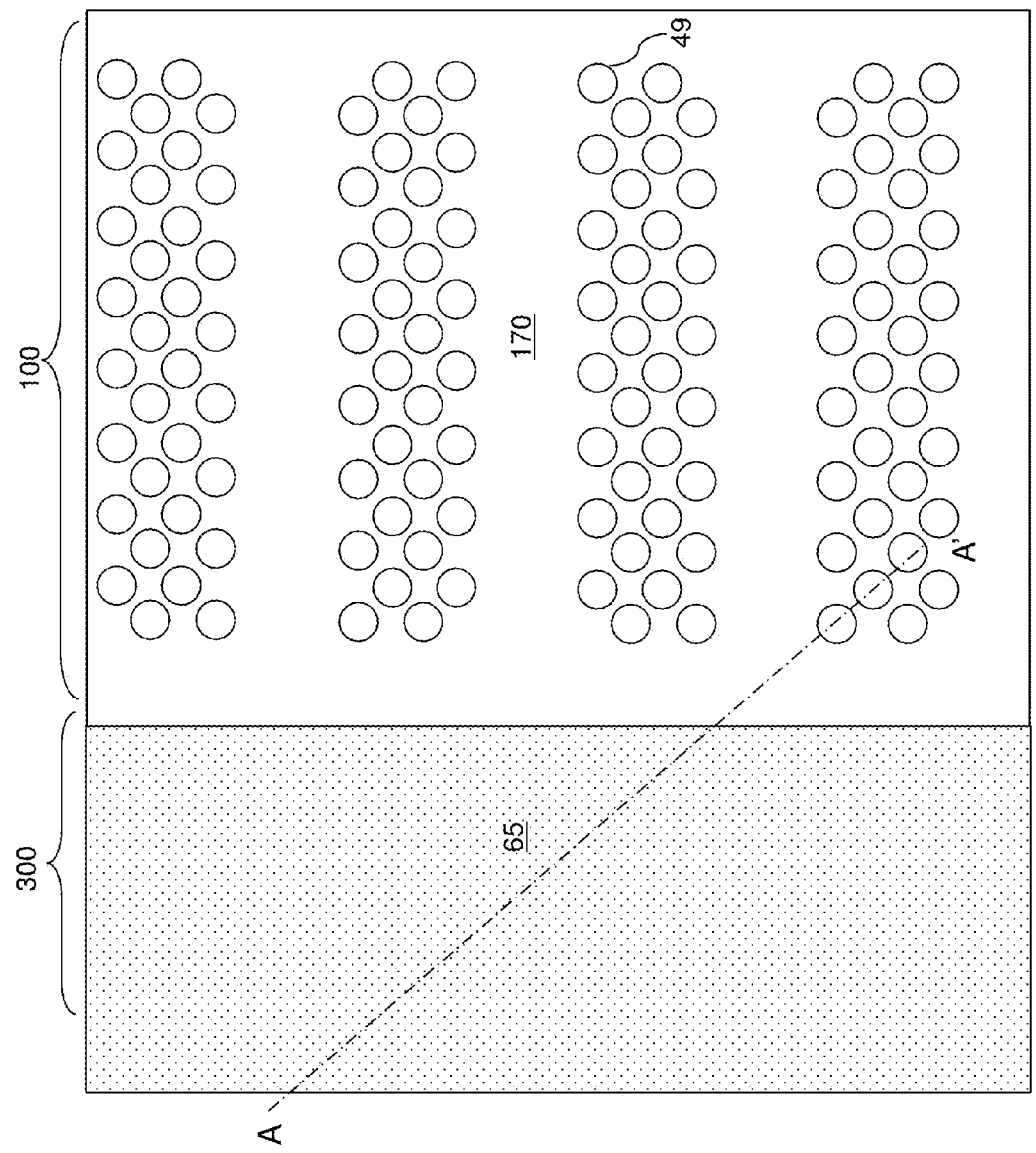
FIG. 3B is a top-down view of the first exemplary structure of FIG. 3A according to the first embodiment of the present disclosure. The vertical plane A-A' corresponds to the plane of the vertical cross-sectional view of FIG. 3A.

Referring to FIGS. 3A and 3B, a lithographic material stack (not shown) including at least a photoresist layer can be formed over the first insulating cap layer 170 and the alternating stack (32, 42), and can be lithographically patterned to form openings therein. The pattern in the lithographic material stack can be transferred through the first insulating cap layer 170 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to the top surface of the substrate semiconductor layer 10 within the substrate between the lower select gate electrodes. In one embodiment, an overetch into the substrate semiconductor layer 10 may be optionally performed after the top surface of the substrate semiconductor layer 10 is physically exposed at a bottom of each memory opening 49. The overetch may be performed prior to, or after, removal of the lithographic material stack. In other words, the recessed surfaces of the substrate semiconductor layer 10 may be vertically offset from the undressed top surfaces of the substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the substrate semiconductor layer 10. Each of the memory openings 49 can include a sidewall (or a plurality of sidewalls) that extends substantially perpendicular to the topmost surface of the substrate. The region in which the array of memory openings 49 is formed is herein referred to as a device region.

A memory stack structure can be formed in each of the memory opening employing various embodiments of the present disclosure. FIGS. 4A-4J illustrate sequential vertical cross-sectional views of a memory opening within the exemplary device structure during formation of a first exemplary memory stack structure according to a first embodiment of the present disclosure. Formation of the exemplary memory stack structure can be performed within each of the memory openings 49 in the exemplary device structure illustrated in FIG. 3A.

A memory stack structure can be formed in each of the memory opening employing various embodiments of the present disclosure. FIG. 4A-4H illustrate sequential vertical cross-sectional views of a memory opening within the first exemplary structure during formation of an exemplary memory stack structure according to a embodiment of the present disclosure. Formation of the exemplary memory stack structure can be performed within each of the memory openings 49 in the first exemplary structure illustrated in FIG. 3.

Referring to FIG. 4A, a memory opening 49 in the first exemplary structure of FIG. 1 is illustrated in a magnified view. The memory opening 49 extends through the first insulating cap layer 170, the alternating stack (32, 42), the gate dielectric layer 12, and optionally into an upper portion of the substrate semiconductor layer 10. The recess depth of the bottom surface of each memory opening with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 4B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the substrate semiconductor layer 10. In one embodiment, the epitaxial channel portion 11 can be doped with electrical dopants of the same conductivity type as the substrate semiconductor layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 4C, a series of layers including at least one blocking dielectric layer (501, 503), a charge storage layer 504, a tunneling dielectric layer 506, and an optional first semiconductor channel layer 601L can be sequentially deposited in the memory openings 49. The at least one blocking dielectric layer (501, 503) can include, for example, a first blocking dielectric layer 501 and a second blocking dielectric layer 503.

The first blocking dielectric layer 501 can be deposited on the sidewalls of each memory opening 49 by a conformal deposition method. The first blocking dielectric layer 501 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501 can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501 can be in a range from 1 nm to 20 nm, although lesser and greater thicknesses can also be employed. The first blocking dielectric layer 501 can subsequently function as a dielectric material portion that blocks leakage of stored electrical charges to control gate electrodes. In one embodiment, the first blocking dielectric layer 501 includes aluminum oxide.

The second blocking dielectric layer 503 can be formed on the first blocking dielectric layer 501. The second blocking dielectric layer 503 can include a dielectric material that is different from the dielectric material of the first blocking dielectric layer 501. In one embodiment, the second blocking dielectric layer 503 can include silicon oxide (e.g., $SiO_2$), a dielectric metal oxide having a different composition than the first blocking dielectric layer 501, silicon oxynitride, silicon nitride, or a combination thereof. In one embodiment, the second blocking dielectric layer 503 can include silicon oxide. The second blocking dielectric layer 503 can be formed by a conformal deposition method such as low pressure chemical vapor deposition, atomic layer deposition, or a combination thereof. The thickness of the second blocking dielectric layer 503 can be in a range from 1 nm to 20 nm, although lesser and greater thicknesses can also be employed. Alternatively, the first blocking dielectric layer 501 and/or the second blocking dielectric layer 503 can be omitted, and a blocking dielectric layer can be formed after formation of backside recesses on surfaces of memory films to be subsequently formed.

Subsequently, the charge storage layer 504, the tunneling dielectric layer 506, and the optional first semiconductor channel layer 601L can be sequentially formed. In one embodiment, the charge storage layer 504 can be a charge trapping material including a dielectric charge trapping material, which can be, for example, silicon nitride. Alternatively, the charge storage layer 504 can include a conductive material such as doped polysilicon or a metallic material that is patterned into multiple electrically isolated portions (e.g., floating gates), for example, by being formed within lateral recesses into sacrificial material layers 42. In one embodiment, the charge storage layer 504 includes a silicon nitride layer.

The charge storage layer 504 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 504 may comprise an insulating charge trapping material, such as one or more silicon nitride segments. Alternatively, the charge storage layer 504 may comprise conductive nanoparticles such as metal nanoparticles, which can be, for example, ruthenium nanoparticles. The charge storage layer 504 can be formed, for example, by chemical vapor deposition (CVD), atomic layer deposition (ALD), physical vapor deposition (PVD), or any suitable deposition technique for storing electrical charges therein. The thickness of the charge storage layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501, 503, 504, 506, 601L).

Referring to FIG. 4D, the optional first semiconductor channel layer 601L, the tunneling dielectric layer 506, the charge storage layer 504, the at least one blocking dielectric layer (501, 503) are sequentially anisotropically etched employing at least one anisotropic etch process. The portions of the first semiconductor channel layer 601L, the tunneling dielectric layer 506, the charge storage layer 504, and the at least one blocking dielectric layer (501, 503) located above the top surface of the first insulating cap layer 170 can be removed by the at least one anisotropic etch process. Further, the horizontal portions of the first semiconductor channel layer 601L, the tunneling dielectric layer 506, the charge storage layer 504, and the at least one blocking dielectric layer (501, 503) at a bottom of each cavity 49' can be removed to form openings in remaining portions thereof. Each of the first semiconductor channel layer 601L, the tunneling dielectric layer 506, the charge storage layer 504, and the at least one blocking dielectric layer (501, 503) can be etched by anisotropic etch process.

Each remaining portion of the first semiconductor channel layer 601L constitutes a first semiconductor channel portion 601. In one embodiment, the charge storage layer 504 can be a continuous layer, i.e., can be a charge storage layer. A surface of the epitaxial channel portion 11 can be physically exposed underneath the opening through the first semiconductor channel portion 601, the tunneling dielectric layer 506, the charge storage layer 504, and the at least one blocking dielectric layer (501, 503). If the epitaxial channel portion 11 is not present, a top surface of the substrate semiconductor layer 10 can be physically exposed underneath the memory cavity 49'. Optionally, the physically exposed portion of the epitaxial channel portion 11 can be vertically recessed. A tunneling dielectric layer 506 is surrounded by a charge storage layer 504. The charge storage layer 504 can comprise a charge trapping material or a floating gate material.

The set of the tunneling dielectric layer 506, the charge storage layer 504, the second blocking dielectric layer 503, and the first blocking dielectric layer 501 collectively constitutes a memory film 50. In one embodiment, the first semiconductor channel portion 601, the tunneling dielectric layer 506, the charge storage layer 504, the second blocking dielectric layer 503, and the first blocking dielectric layer 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 4E, a second semiconductor channel layer 602L can be deposited directly on the semiconductor surface of the epitaxial channel portion 11 over the substrate 10, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 4F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4G, the horizontal portion of the dielectric core layer 62L can be removed, for example, by a recess etch from above the top surface of the first insulating cap layer 170. Further, the horizontal portion of the second semiconductor channel layer 602L located above the top surface of the first insulating cap layer 170 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 506 is surrounded by a charge storage layer 504, and laterally surrounds a portion of the semiconductor channel 60. Each adjoining set of a first blocking dielectric layer 501, a second blocking dielectric layer 503, a charge storage layer 504, and a tunneling dielectric layer 506 collectively constitute a memory film 50, which can store electrical charges with a macroscopic retention time. In some embodiments, a first blocking dielectric layer 501 and/or a second blocking dielectric layer 503 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the first insulating cap layer 170 and the bottom surface of the first insulating cap layer 170. Each remaining portion of the dielectric core layer 62L constitutes a dielectric core 62.

Referring to FIG. 4H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the first insulating cap layer 170, for example, by chemical mechanical planarization (CMP) or a recess etch to form the drain regions 63. The combination of the memory film 50, drain region 63, semiconductor channel 60 and optionally the dielectric core 62 forms a memory stack structure 55.

Figure 5:
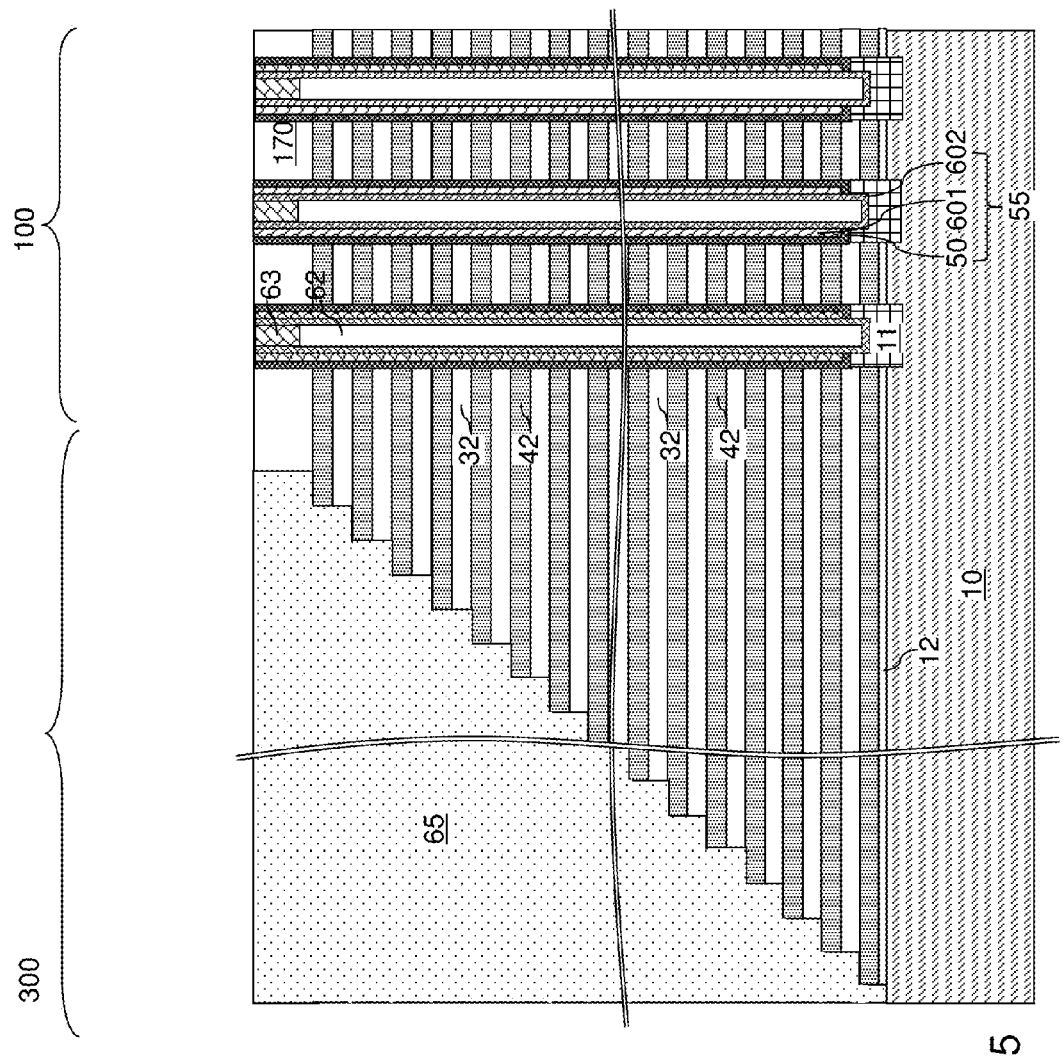
FIG. 5 is a vertical cross-sectional view of the first exemplary structure after formation of memory stack structures according to the first embodiment of the present disclosure.

Multiple instances of the memory stack structure 55 can be embedded into the first exemplary structure illustrated in FIGS. 3A and 3B. FIG. 5 illustrates the first exemplary structure that incorporates multiple instances of the exemplary memory stack structure of FIG. 4H. The first exemplary structure includes a semiconductor device, which comprises a stack (32, 42) including an alternating plurality of material layers (e.g., the sacrificial material layers 42) and insulating layers 32 located over a semiconductor substrate 10, and a memory opening extending through the stack (32, 42). The semiconductor device further comprises a memory stack structure 55 vertically extending from a bottommost layer (e.g., the bottommost sacrificial material layer 42) of the stack to a topmost layer (e.g., the topmost and a horizontal surface of the semiconductor substrate.

Figure 6A:
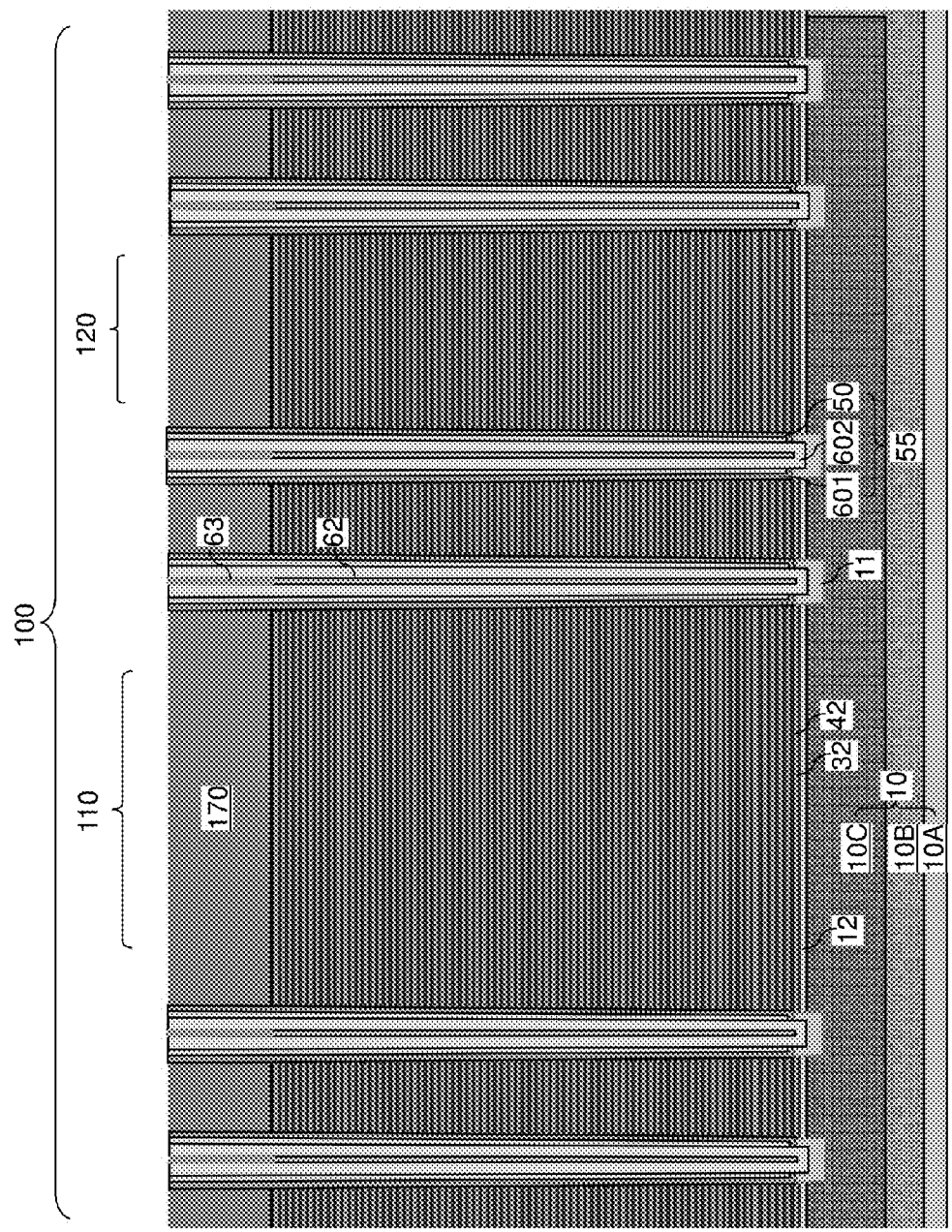
FIG. 6A is another vertical cross-sectional view of the first exemplary structure after formation of the memory stack structures according to the first embodiment of the present disclosure.
Figure 6B:
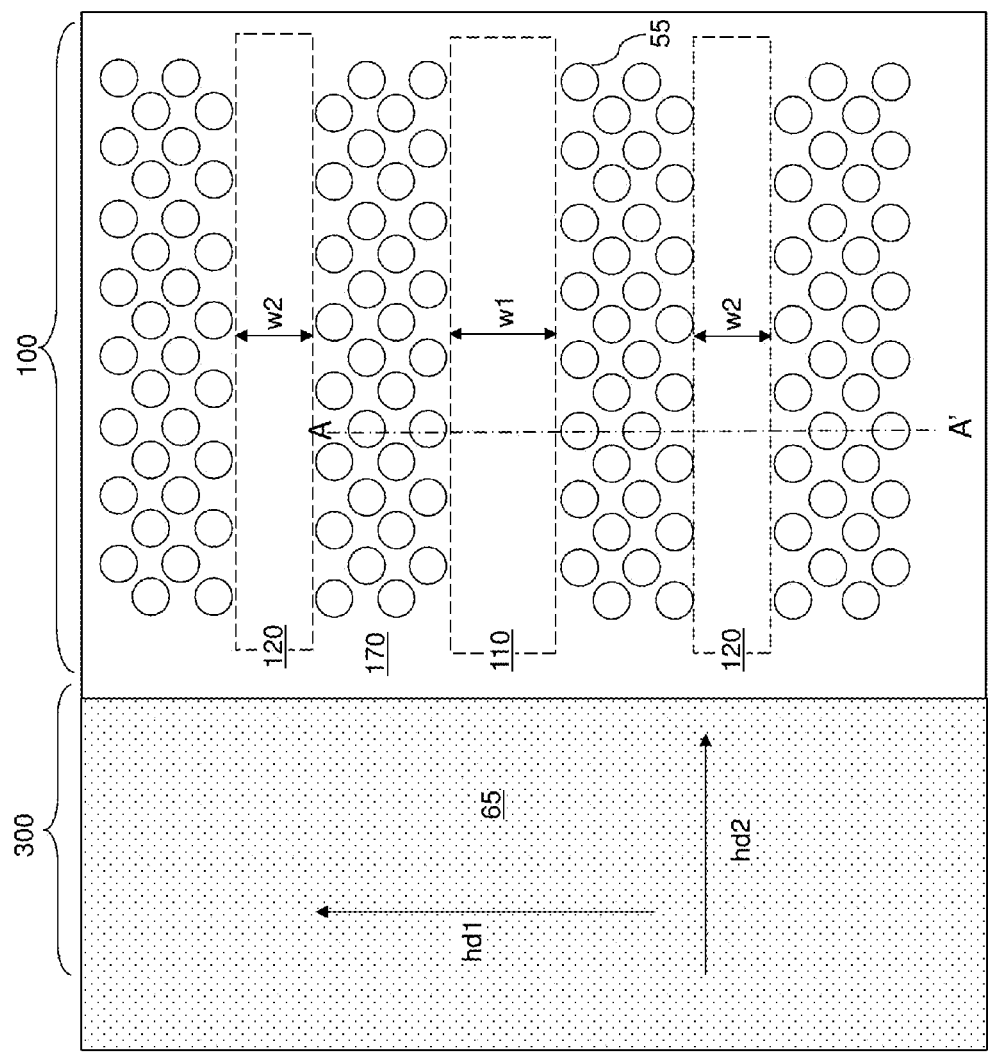
FIG. 6B is a top-down view of the first exemplary structure of FIG. 6A. The vertical plane A-A' corresponds to the plane of the vertical cross-sectional view of FIG. 6A. The vertical plane X-X' corresponds to the plane of the vertical cross-sectional view of FIG. 5.

FIG. 6A is another vertical cross-sectional view of the first exemplary structure of FIG. 5. FIG. 6B is a top-down view of the first exemplary structure of FIG. 6A. The vertical plane A-A' corresponds to the plane of the vertical cross-sectional view of FIG. 6A. Each memory stack structure 55 comprises a plurality of memory elements embodied as portions of the charge storage layer 504 located at levels of the spacer material layers (e.g., the sacrificial material layers 42). Each memory stack structure 55 is formed through the first insulating cap layer 170 and the alternating stack (32, 42). FIG. 6A expressly shows various doped semiconductor material regions (10A, 10B, 10C) within the substrate semiconductor layer 10. Each doped semiconductor material region (10A, 10B, 10C) can have a different type of doping than neighboring doped semiconductor material regions (10A, 10B, 10C). For example, region 10C may comprise a doped p-well, region 10B may comprise an intermediate doped well and region 10A may comprise a silicon wafer.

The memory stack structures 55 can be arranged in clusters. Each cluster may comprise a memory block or sub-block. The clusters 55 at are laterally spaced apart along a first horizontal (e.g., bit line) direction hd1, which is perpendicular to a second horizontal (e.g., word line) direction hd2 that is the direction of propagation of the stepped surfaces, i.e., the horizontal direction along which the stepped surfaces change height. A wider gap and a narrower gap can be alternately provided between the clusters of the memory stack structures 55 along the second horizontal direction hd2. Each wider gap corresponds to a backside contact trench region 110 in which a backside contact trench (which extends through the entire stack) is subsequently formed, and each narrow gap corresponds to a separator trench region 120 in which a separator trench that divides only the drain select gate electrodes but not the word lines is subsequently formed. Each backside contact trench region 110 can have a first width w1, and each separator trench region 120 can have a second width w2. In an illustrative example, the first width w1 can be in a range from 500 nm to 2,000 nm, and the second width w2 can be in a range from 100 nm to 500 nm, although lesser and greater widths can be employed for each.

Figure 7:
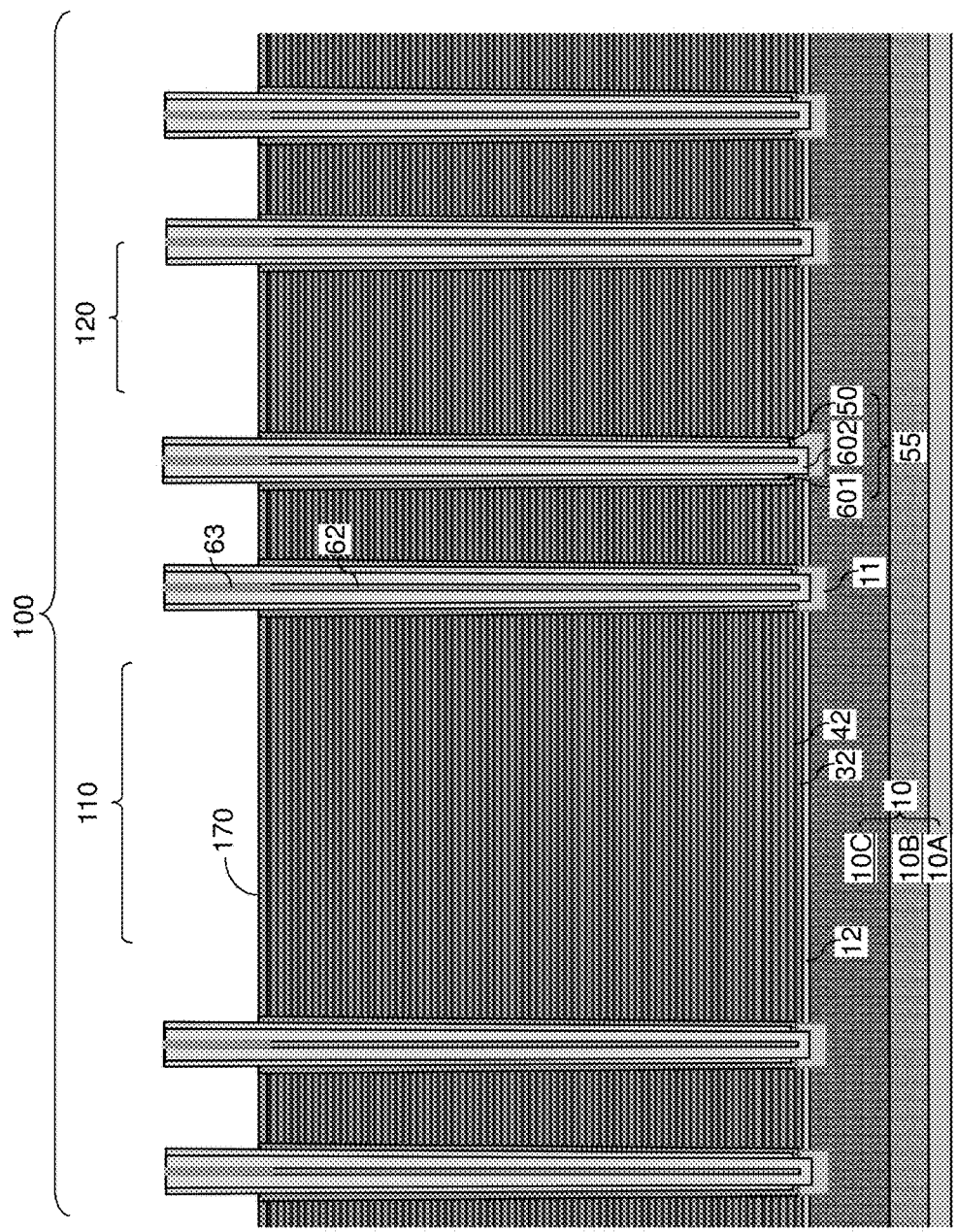
FIG. 7 is a vertical cross-sectional view of the first exemplary structure after recessing the first insulating cap layer according to the first embodiment of the present disclosure.

Referring to FIG. 7, the first insulating cap layer 170 can be vertically recessed employing as selective etch process, which may be an anisotropic etch process (such as a reactive ion etch process) or an isotropic etch process (such as a wet etch process). The etch process is selective to the semiconductor materials of the semiconductor channels (601, 602) and the drain regions 63. For example, if the first insulating cap layer 170 includes doped silicate glass or undoped silicate glass (e.g., silicon oxide layer), the etch process can employ hydrofluoric acid, which etches silicate glass materials selective to semiconductor materials. The duration and/or the concentration of the etchant can be selected so that the first insulating cap layer 170 is only partially removed, and a remaining portion of the first insulating cap layer 170 is present over the alternating stack (32, 42) after the etch process.

After the etch process, an upper portion of each memory stack structure 55 protrudes above a recessed top surface of the first insulating cap layer 170. In one embodiment, portions of the memory films 50 that protrude above the recessed top surface of the first insulating cap layer 170 can be completely or partially removed.

In one embodiment, the etchant can be selected such that all portions of the memory films 50 that protrude above the recessed top surface of the first insulating cap layer 170 can be completely removed. For example, a mixture of hydrofluoric acid and dilute phosphoric acid can be employed to completely remove the portions of the memory film 50 that protrude above the recessed top surface of the first insulating cap layer 170.

Alternatively, the protruding portions of the memory film 50 can be only partially removed from above the recessed top surface of the first insulating cap layer 170. In one embodiment, a cylindrical remaining portion of a memory film 50 that is thinner than the memory films 50 as provided prior to the etch process can be formed around each protruding portion of the semiconductor channels (601, 602). In this case, each protruding remnant of the memory films 50 can include a dielectric material (such as silicon nitride and/or a high-k dielectric oxide) that is not silicon oxide.

The depth of recess of the first insulating cap layer 170 can be in a range from 40% to 90% of the thickness of the first insulating cap layer 170 as formed at the processing step of FIG. 1. The thickness of the remaining portion of the first insulating cap layer 170 may be in a range from 30 nm to 300 nm, although lesser and greater thicknesses can also be employed.

Figure 8:
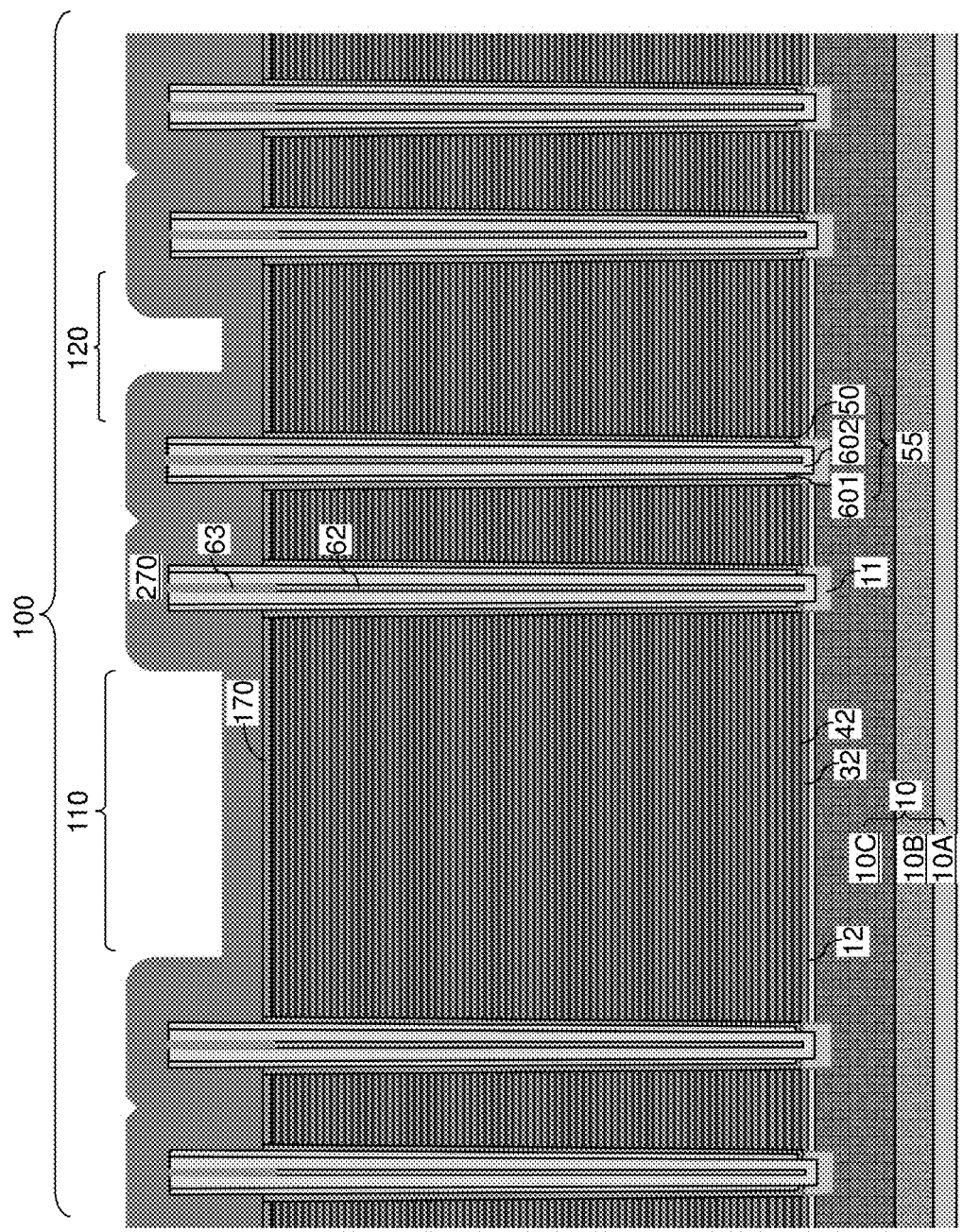
FIG. 8 is a vertical cross-sectional view of the first exemplary structure after formation of a second insulating cap layer according to the first embodiment of the present disclosure.

Referring to FIG. 8, a sidewall spacer layer, such as a second insulating cap layer 270 is deposited over the protruding portions of the plurality of memory stack structures 55 and over the recessed first insulating cap layer 170. The second insulating cap layer 270 can include doped silicate glass or undoped silicate glass. The second insulating cap layer 270 is a conformal dielectric material layer that is formed by a conformal deposition process such as low pressure chemical vapor deposition (LPCVD). Alternatively, the sidewall spacer layer may comprise an electrically conductive material, such as TiN or a metal.

The second insulating cap layer 270 is thick enough to be to fill entire space among the protruding portions of the memory stack structures 55 within each cluster of memory stack structures 55, but is thin enough not to fill the entire space of each separator trench region 120. Thus, substantially vertical sidewalls of the second insulating cap layer 270 are present within each separator trench region 120 and within each backside contact trench region 110. The substantially vertical sidewalls of the second insulating cap layer 270 can be equidistant from the sidewalls of the most proximal sidewall of the protruding portions of the memory stack structures 55. The distance between the substantially vertical sidewalls of the second insulating cap layer 270 and the most proximal sidewall of the protruding portions of the memory stack structures 55 can be the thickness of the second insulating cap layer 270. The thickness of the second insulating cap layer 270 can be in a range from 20% to 80% of the initial thickness of the first insulating cap layer 170 as formed at the processing step of FIG. 1. For example, the thickness of the second insulating cap layer 270 can be in a range from 60 nm to 400 nm, although lesser and greater thicknesses can also be employed.

Each substantially vertical sidewall of the second insulating cap layer 270 can have a curvature due to the constant distance from a respective most proximal sidewall of the memory stack structures 55. Specifically, each substantially vertical sidewall of the second insulating cap layer 270 can be curved to provide a convex surface that is convex along a horizontal plane and substantially linear along the vertical direction.

Figure 9A:
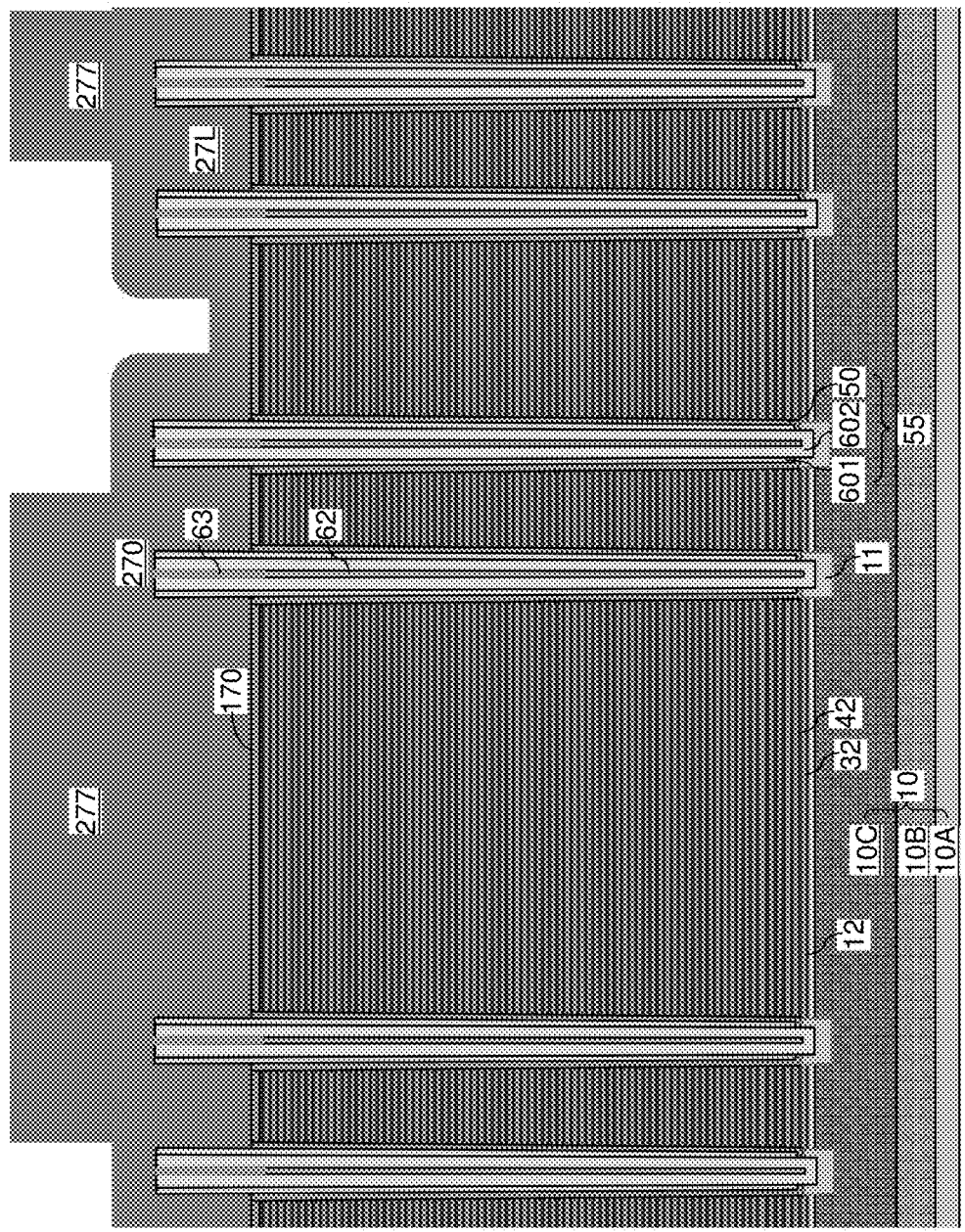
FIG. 9A is a vertical cross-sectional view of the first exemplary structure after formation of a patterned masking layer according to the first embodiment of the present disclosure.

Referring to FIGS. 9A and 9B, a patterned masking layer 277 can be formed over the second insulating cap layer 270. The patterned masking layer 277 can be a soft mask layer such as a photoresist layer, or may be a hard mask layer such as a polysilicon layer that is patterned by a photoresist layer. The patterned masking layer 277 can be formed as a blanket (unpatterned) layer, and is subsequently lithographically patterned to physically expose the separator trench regions 120 and immediate vicinity that include peripheral regions of the clusters of memory stack structures 55 that adjoin the separator trench regions 120. The patterned masking layer 277 covers the center region of each cluster of memory stack structures 55, each backside contact trench region 110, and peripheral regions of the clusters of memory stack structures 55 that adjoin the backside contact trench regions 110. In one embodiment, each patterned portion of the patterned masking layer 277 can have a strip shape.

Figure 10:
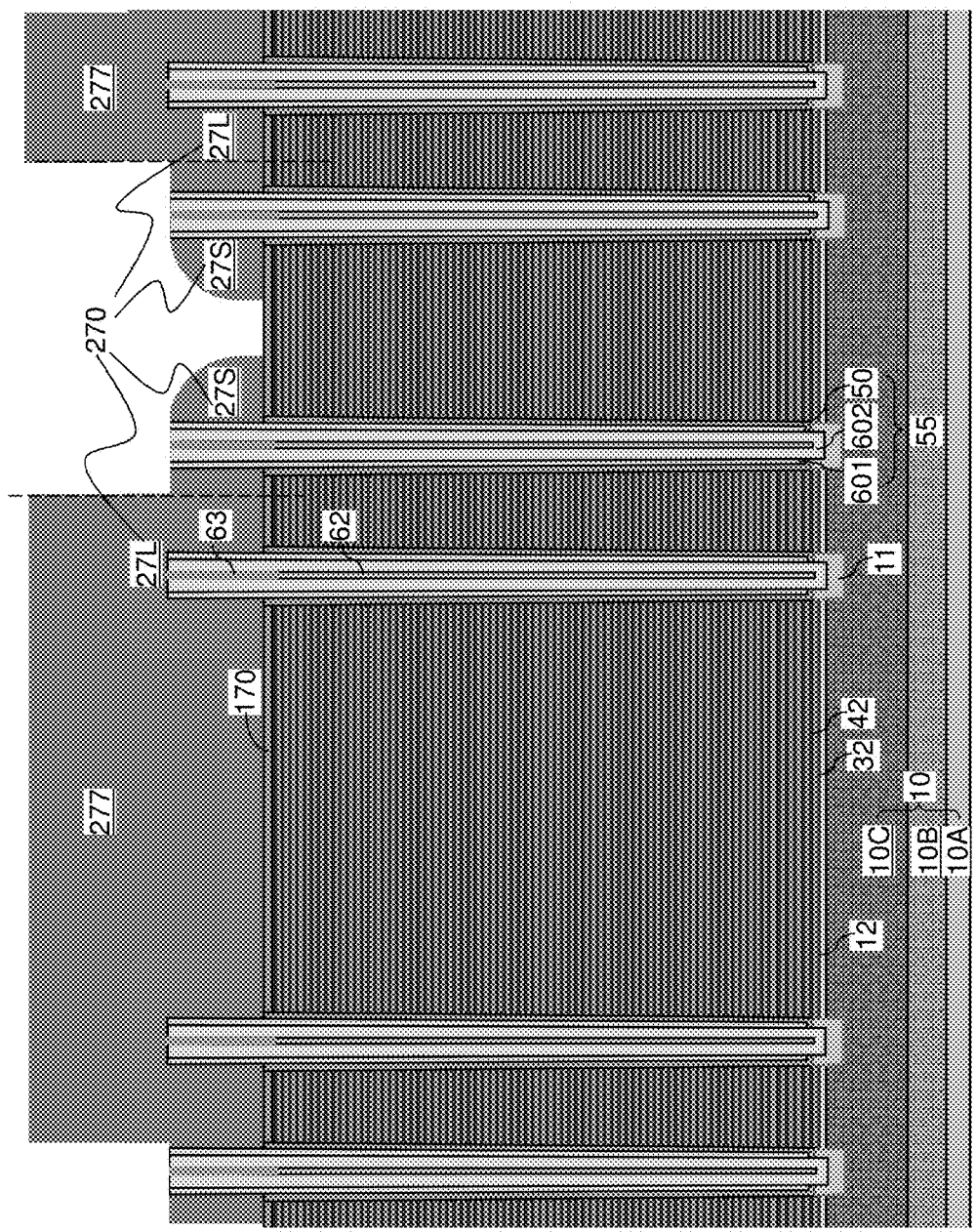
FIG. 10 is a vertical cross-sectional view of the first exemplary structure after formation of insulating spacer portions by anisotropically etching the second insulating cap layer according to the first embodiment of the present disclosure.

Referring to FIG. 10, an anisotropic sidewall spacer etch is performed on the second insulating cap layer 270 to form sidewall spacers on the exposed upper portions of the memory stack structures 55. The anisotropic etch removes physically exposed horizontal portions of the second insulating cap layer 270. Physically exposed vertical portions of the second insulating cap layer 270 are vertically recessed during the anisotropic etch. Remaining portions of the second insulating cap layer 270 that are not covered by the patterned masking layer 277 constitute insulating spacer portions 27S. A top surface of the first insulating cap layer 170 can be physically exposed between each pair of insulating spacer portions 27S. Top surfaces of a subset of the memory stack structures 55 can be physically exposed in regions that are not covered by the patterned masking layer 277. Each portion of the second insulating cap layer 270 that underlie the patterned masking layer 277 is herein referred to as an insulating sheet portion 27L. The remaining portions of the second insulating cap layer 270 include a plurality of insulating spacer portions 27S and insulating sheet portions 27L.

Figure 11A:
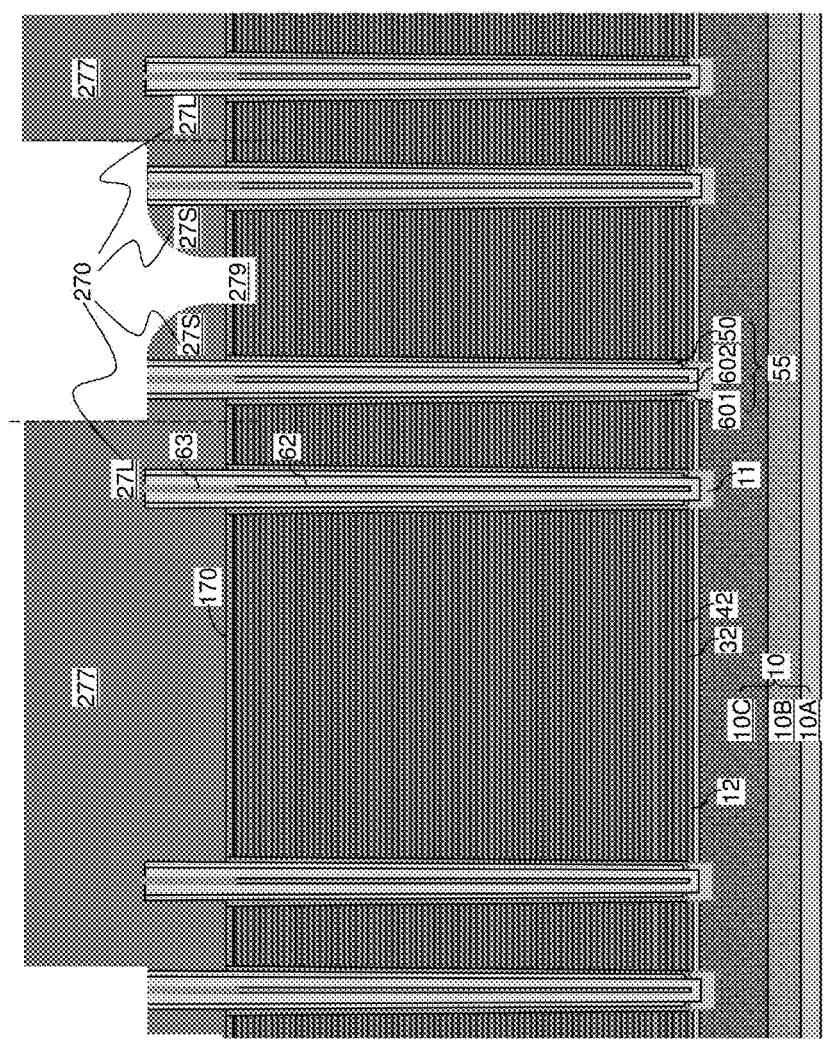
FIG. 11A is a vertical cross-sectional view of the first exemplary structure after formation of separator trenches in areas between insulating spacers according to an embodiment of the present disclosure.
Figure 11B:
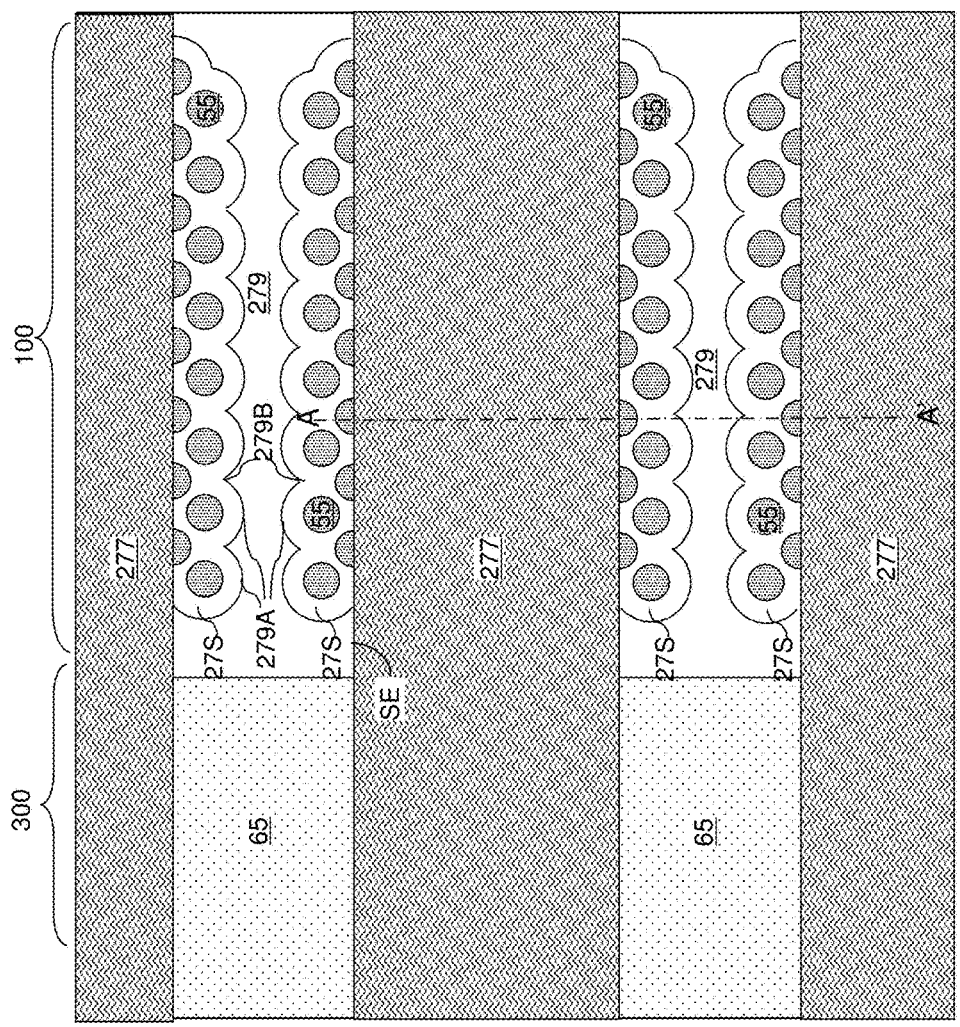
FIG. 11B is a top-down view of the first exemplary structure of FIG. 10A according to the first embodiment of the present disclosure. The vertical plane A-A' corresponds to the plane of the vertical cross-sectional view of FIG. 11A.

Referring to FIGS. 11A and 11B, separator trenches 279 are formed by recessing regions including physically exposed surfaces of the first insulating cap layer 170. The separator trenches 279 are formed through an upper portion of the alternating stack (32, 42). Each separator trench 279 extends through a first subset of the spacer material layers (such as sacrificial material layers 42), and does not extend into a second subset of the spacer material layers that underlie the first subset of the spacer material layers. Specifically, the separator trenches 279 extend through the first insulating cap layer 170 and a first subset of sacrificial material layers 42 located at the levels of drain select gate electrodes to be subsequently formed, but does not extend through a second subset of the sacrificial material layers 42 that are located at levels of control gate electrodes to be subsequently formed. Thus, the separator trenches 279 divides the subset of sacrificial material layers 42 to be subsequently replaced with drain select gate electrodes, but does not divide the sacrificial material layers 42 to be replaced with control gate electrodes or source select gate electrodes.

Each separator trench 279 is formed in a region that is not covered by the combination of the patterned photoresist layer 277 and the insulating spacer portions 27S, and between a pair of insulating spacer portions 27S. Thus, the trench 279 is etched partially into the stack using layer 277 and spacer portions 27S as a mask. The sidewalls of the separator trenches 279 replicate the pattern of the overlying portion of the sidewalls of the second insulating cap layer 270, i.e., the sidewalls of the insulating spacer portions 27S. Thus, as shown in FIG. 11B, the separator trench 279 includes non-planar sidewalls having protruding portions 279A that protrude into the trench 279 and that are equidistant from respective most proximate sidewalls of the memory stack structures 55. The non-planar sidewalls of each separator trench 279 can be vertically coincident with sidewalls of the remaining portions of the second insulting cap layer 270. Each separator trench 279 can include a plurality of protruding portions 279A that are laterally adjoined together. Each of the protruding portions 279A can be adjoined to at least one respective neighboring protruding portion 279A at a vertical edge 279B. The protruding portions 279A may have convex surfaces that are adjoined to one another at substantially vertical edges 279B and that are equidistant from respective most proximate sidewalls of the memory stack structures 55. The non-planar sidewalls extend in a vertical direction perpendicular to a top surface 7 of the substrate 10 and the convex surfaces of portions 279A protrude in a horizontal direction parallel to the top surface 7 of the substrate 10. In one embodiment, the vertical edge can be adjoined to a vertical planar surface, which can be a vertical sidewall of the second insulating cap layer 270 that underlies a straight edge SE of the patterned masking layer 277.

Figure 12:
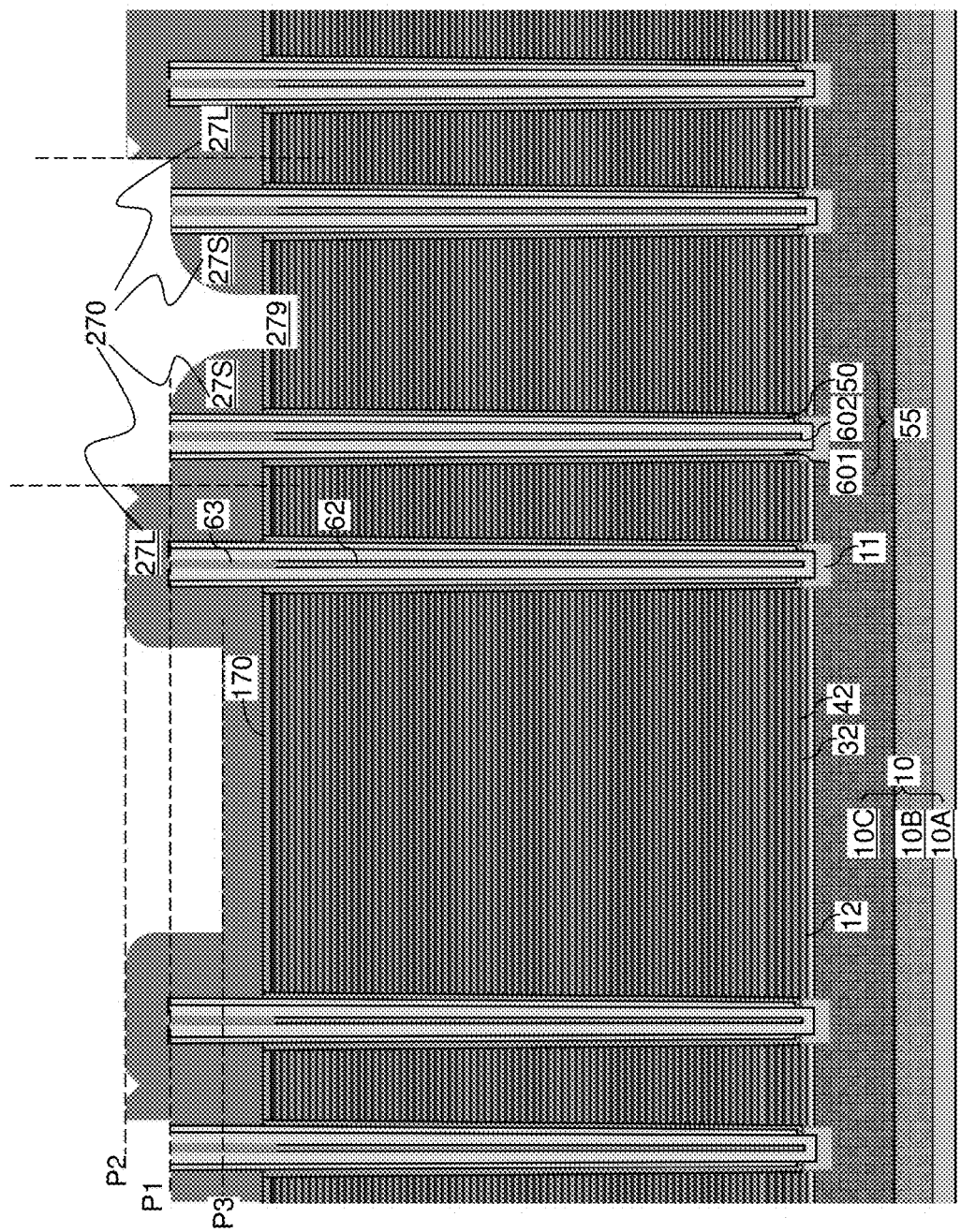
FIG. 12 is a vertical cross-sectional view of the first exemplary structure after removal of the patterned masking layer according to the first embodiment of the present disclosure.

Referring to FIG. 12, the patterned masking layer 277 can be removed selective to the second insulating cap layer 270 and the materials of the alternating stack (32, 42). For example, if the patterned masking layer 277 is a photoresist layer, the patterned masking layer 277 can be removed by ashing.

The second insulating layer 270 can have top surfaces at multiple levels. For example, the second insulating layer 270 can include first top surfaces located within a first horizontal plane P1 that is located about the height of the top surfaces of the memory stack structures 55, second top surfaces located within a second horizontal plane P2 located above the height of the top surfaces of the memory stack structures 55, and third top surfaces located within a third horizontal plane P3 that is located below the height of the top surfaces of the memory stack structures 55.

Figure 13:
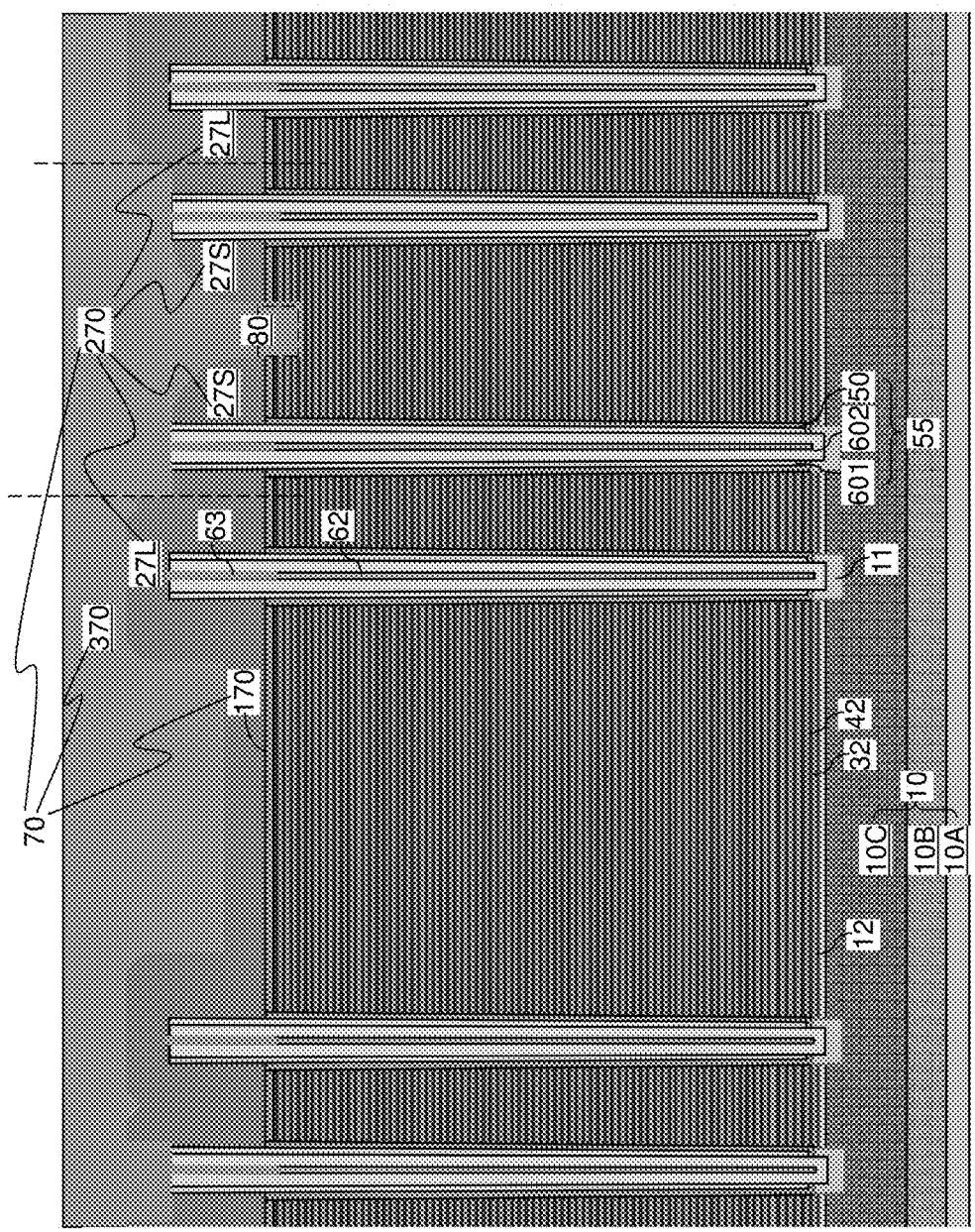
FIG. 13 is a vertical cross-sectional view of the first exemplary structure after deposition and planarization of a third insulating cap layer according to the first embodiment of the present disclosure.

Referring to FIG. 13, a third insulating cap layer 370 can be deposited. The third insulating cap layer 370 includes a dielectric material such as a doped silicate glass or an undoped silicate glass. The dielectric material of the third insulating cap layer 370 can be the same as, or different from, the dielectric material of the second insulating cap layer 270. The dielectric material of the third insulating cap layer 370 can be the same as, or different from, the dielectric material of the first insulating cap layer 170. The third insulating cap layer 370 is a dielectric material layer that fills the separator trenches 279 and overlies the alternating stack (32, 42). The third insulating cap layer 370 can be deposited by chemical vapor deposition (e.g., using a TEOS source to form a silicon oxide layer) or spin coating. The third insulating cap layer 370 can be planarized after deposition, for example, by chemical mechanical planarization, or can be deposited by a self-planarizing process such as spin coating. The first, second, and third insulating cap layers (170, 270, 370) are herein collectively referred to as insulating cap layers 70. The portion 80 of the third insulating cap layer 370 which fills the separator trench 279 may have concave surfaces that contact the respective convex surfaces of the protruding portions 279A of the separator trench sidewalls.

Figure 14:
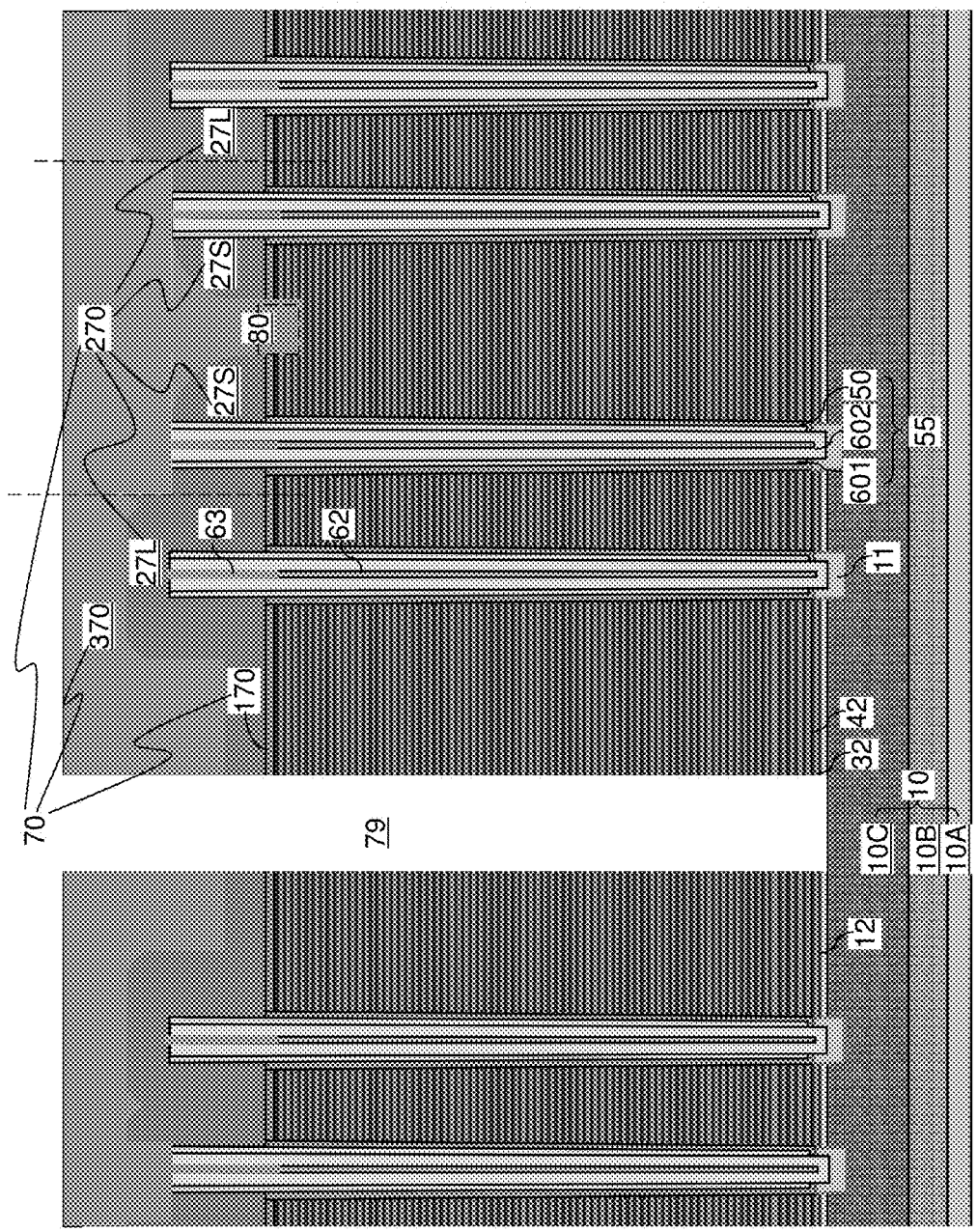
FIG. 14 is a vertical cross-sectional view of the first exemplary structure after formation of backside trenches according to the first embodiment of the present disclosure.

Referring to FIG. 14, at least one dielectric support pillar (not shown) may be optionally formed through the alternating stack (32, 42). Backside contact trenches 79 can be formed between the memory blocks and between the memory sub-blocks containing clusters of memory stack structures 55. In one embodiment, each backside contact trench 79 can extend along the second horizontal direction hd2 (see FIG. 6B) so that the sub-blocks (e.g., clusters of the memory stack structures 55) are laterally spaced along the first horizontal direction hd1 (See FIG. 6B). The backside contact trenches 79 may have uniform sidewalls (i.e., vertical sidewalls without any protrusions). Each cluster of memory stack structures 55 in conjunction with the portions of the alternating stack (32, 42) constitutes a memory sub-block. Each memory sub-block is laterally spaced from one another by the backside contact trenches 79 or the separator trenches 279.

Figure 15:
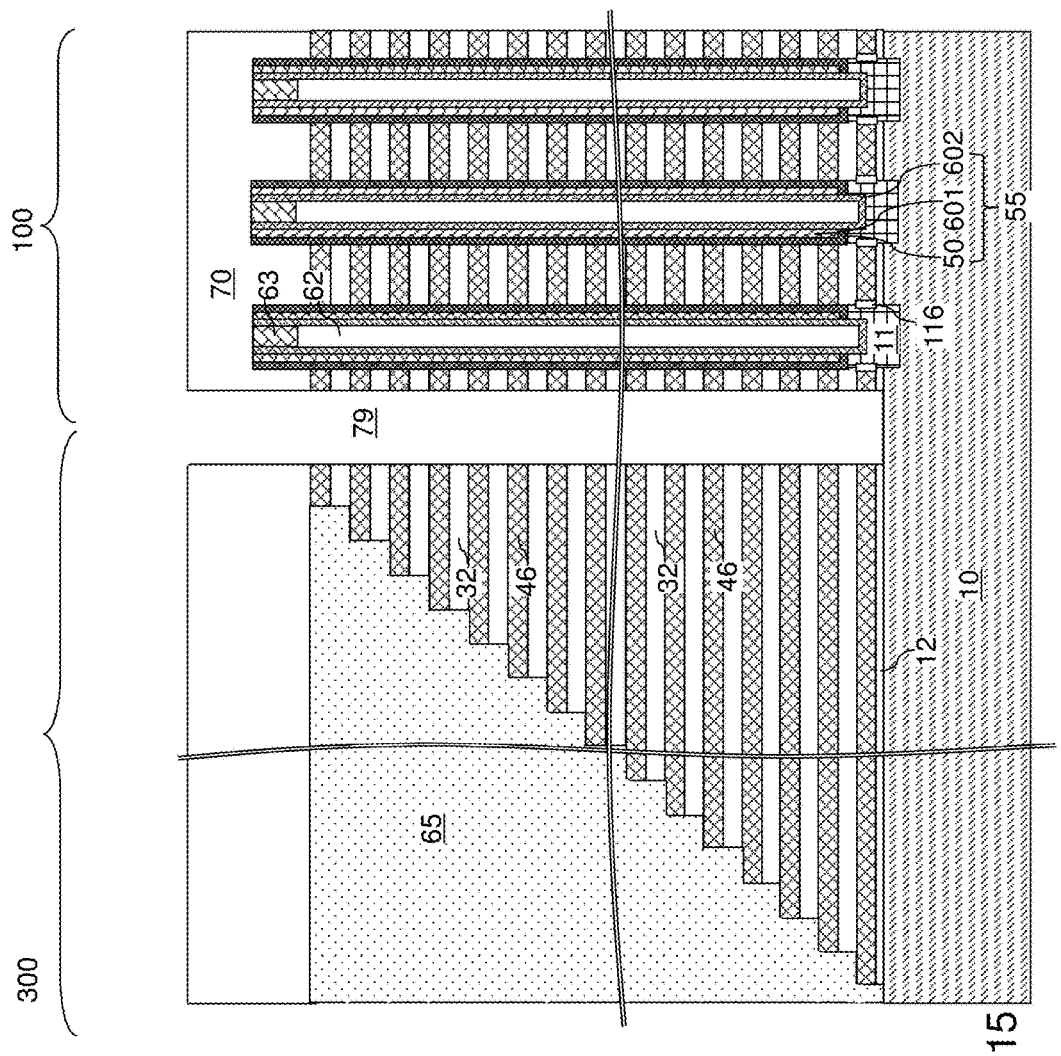
FIG. 15 is a vertical cross-sectional view of the first exemplary structure after replacement of the sacrificial material layers with electrically conductive layers according to the first embodiment of the present disclosure.

Referring to FIG. 15, an etchant that selectively etches the second material of the sacrificial material layers 42 with respect to the first material of the insulating layers 32 can be introduced into the backside contact trenches 79, for example, employing an etch process. Backside recesses are formed in volumes from which the sacrificial material layers 42 are removed. The removal of the second material of the sacrificial material layers 42 can be selective to the first material of the insulating layers 32, the material of the at least one dielectric support pillar, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulating layers 32, the at least one dielectric support pillar, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar, and the retro-stepped dielectric material portion 65 can be selected from silicon oxide, silicon nitride, and dielectric metal oxides. In this case, the depth of the backside contact trenches 79 can be modified so that the bottommost surface of the backside contact trenches 79 is located within the gate dielectric layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside contact trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar, the retro-stepped dielectric material portion 65, and the memory stack structures 55 provide structural support while the backside recesses are present within volumes previously occupied by the sacrificial material layers 42.

Each backside recess can be a laterally extending cavity having a lateral dimension that is greater than the vertical extent of the cavity. In other words, the lateral dimension of each backside recess can be greater than the height of the backside recess. A plurality of backside recesses can be formed in the volumes from which the second material of the sacrificial material layers 42 is removed. The memory openings in which the memory stack structures 55 are formed are herein referred to as front side recesses or front side cavities in contrast with the backside recesses. In one embodiment, the device region 100 comprises an array of monolithic three-dimensional NAND strings having a plurality of device levels disposed above the substrate 10. In this case, each backside recess can define a space for receiving a respective word line of the array of monolithic three-dimensional NAND strings.

Each of the plurality of backside recesses can extend substantially parallel to the top surface of the substrate 10. A backside recess can be vertically bounded by a top surface of an underlying insulating layer 32 and a bottom surface of an overlying insulating layer 32. In one embodiment, each backside recess can have a uniform height throughout. Optionally, a backside blocking dielectric layer can be formed in the backside recesses.

Physically exposed surface portions of epitaxial channel portions 11 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11.

A backside blocking dielectric layer (not shown) can be optionally formed. The backside blocking dielectric layer, if present, comprises a dielectric material that functions as a control gate dielectric for the control gates to be subsequently formed in the backside recesses. In case at least one blocking dielectric layer (501, 503) is present within each memory stack structure 55, the backside blocking dielectric layer is optional. In case a blocking dielectric layer is not present in the memory stack structures 55, the backside blocking dielectric layer is present.

At least one metallic material can be deposited in the plurality of backside recesses, on the sidewalls of the backside contact trenches 79, and over the top surface of the insulating cap layers 70. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom.

A plurality of electrically conductive layers 46 can be formed in the plurality of backside recesses, and a continuous metallic material layer (not shown) can be formed on the sidewalls of each backside contact trench 79 and over the insulating cap layers 70. Thus, each sacrificial material layer 42 can be replaced with an electrically conductive layer 46. A backside cavity is present in the portion of each backside contact trench 79 that is not filled with the backside blocking dielectric layer and the continuous metallic material layer.

The deposited metallic material of the continuous metallic material layer is subsequently etched back from the sidewalls of each backside contact trench 79 and from above the insulating cap layers 70, for example, by an isotropic etch. Each remaining portion of the deposited metallic material in the backside recesses constitutes an electrically conductive layer 46. Each electrically conductive layer 46 can be a conductive line structure. Thus, the sacrificial material layers 42 are replaced with the electrically conductive layers 46.

A subset of the electrically conductive layers 46 located at levels below the separator trenches 279 can function as control gate electrodes. The plurality of control gate electrodes within each electrically conductive layer 46 are the control gate electrodes for the vertical memory devices including the memory stack structures 55. In other words, one subset of the electrically conductive layers 46 can be word lines that function as common control gate electrodes for the plurality of vertical memory devices in different memory sub-blocks separated by an overlying separator trench 279 and located within the same memory block. Another subset of the electrically conductive layers 46 located at the levels of the separator trenches can include drain side select gate electrodes for the plurality of vertical memory devices.

Figure 16:
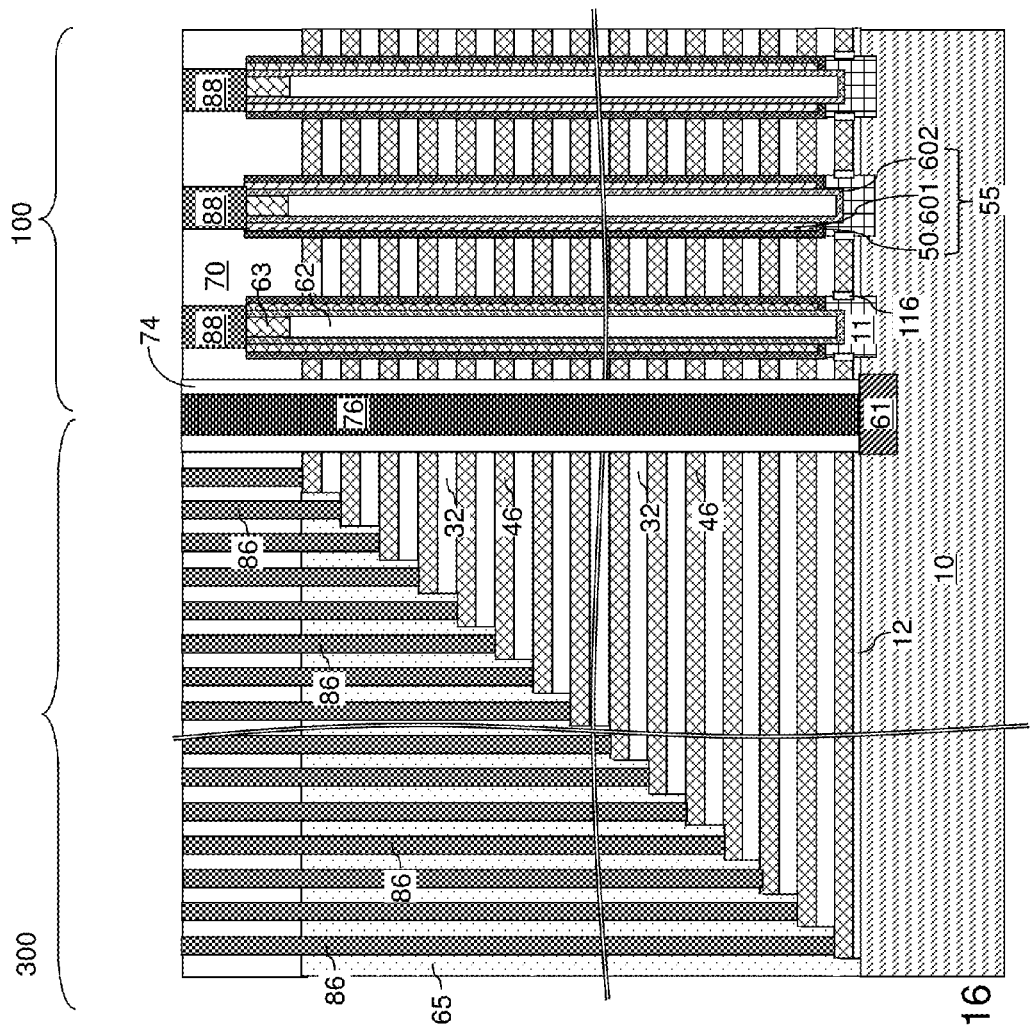
FIG. 16 is a vertical cross-sectional view of the first exemplary structure after formation of backside contact via structures, drain contact via structures, and word line contact via structures according to the first embodiment of the present disclosure.

Referring to FIG. 16, an insulating spacer 74 can be formed at a peripheral region of each backside contact trench 79 by conformal deposition of an insulating material layer and a subsequent anisotropic etch. A source region 61 can be formed underneath each backside contact trench 79 by implantation of electrical dopants. A backside contact via structure 76 (e.g., source electrode or local interconnect) can be formed within insulating spacer 74 directly on a respective source region 61.

Drain contact via structures 88 can be formed through the insulating cap layers 70 on each drain region 63. Word line contact via structures 86 can be formed on the electrically conductive layers 46 through the retro-stepped dielectric material portion 65 and the insulating cap layers 70.

Figure 17:
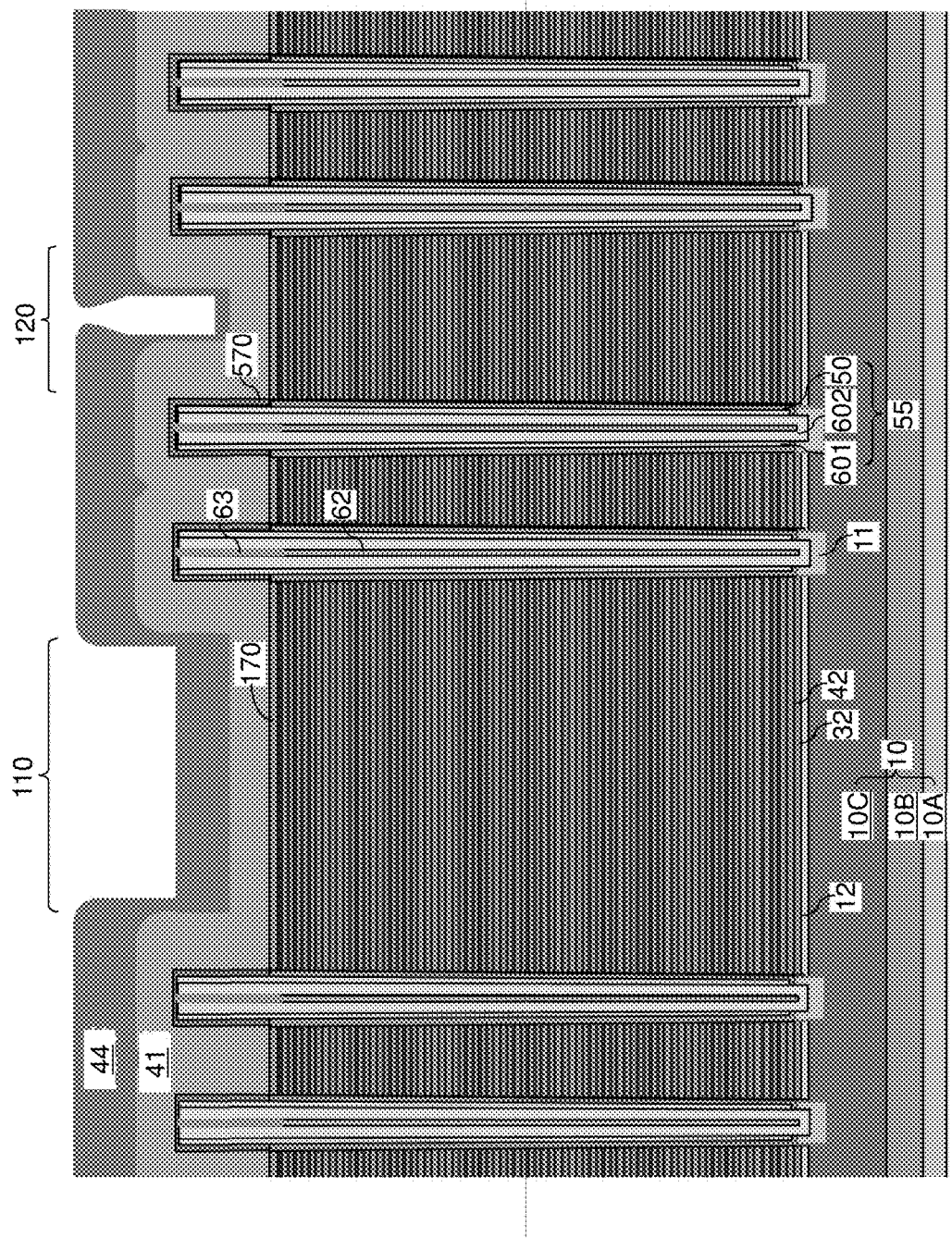
FIG. 17 is a vertical cross-sectional view of a second exemplary structure after formation of a conformal sacrificial layer and a patterning film according to a second embodiment of the present disclosure.

Referring to FIG. 17, a second exemplary structure according to a second embodiment of the present disclosure can be derived from the first exemplary structure of FIG. 7 by optionally forming dielectric cap portions 570, forming a conformal sacrificial layer 41, and forming a patterning film 44 as a masking material layer.

The dielectric cap portions 570 can be formed on physically exposed sidewalls of the protruding upper portions of the memory stack structures 55, for example, by converting surface portions of the semiconductor materials of the semiconductor channels (601, 602) and the drain regions 63 into a dielectric material. For example, thermal oxidation, thermal nitridation, plasma oxidation, and/or plasma nitridation can be employed to convert the physically exposed surface portions of the semiconductor materials into dielectric oxide portions or dielectric nitride portions. The dielectric cap portions 579 can be formed as discrete dielectric material portions that are laterally spaced among one another. Alternatively, the dielectric cap portions 579 may comprise silicon oxide layers deposited by chemical vapor deposition or atomic layer deposition.

The conformal sacrificial layer 41 is deposited over the recessed first insulating cap layer 170 and protruding portions of the plurality of memory stack structures 55. The conformal sacrificial layer 41 includes a material that is different from the materials of the first insulating cap layer 170 and the dielectric cap portions 570. The conformal sacrificial layer 41 is deposited as a conformal material layer directly on the dielectric cap portions 570. In one embodiment, the conformal sacrificial layer 41 can include an amorphous semiconductor material (such as amorphous silicon) or a polycrystalline semiconductor material (such as polysilicon).

The conformal sacrificial layer 41 is thick enough to be to fill entire space among the protruding portions of the memory stack structures 55 within each cluster of memory stack structures 55, but is thin enough not to fill the entire space of each separator trench region 120. Thus, substantially vertical sidewalls of the conformal sacrificial layer 41 are present within each separator trench region 120 and within each backside contact trench region 110. The substantially vertical sidewalls of the conformal sacrificial layer 41 can be equidistant from the sidewalls of the most proximal sidewall of the protruding portions of the memory stack structures 55. The distance between the substantially vertical sidewalls of the conformal sacrificial layer 41 and the most proximal sidewall of the protruding portions of the memory stack structures 55 can be the thickness of the conformal sacrificial layer 41. The thickness of the conformal sacrificial layer 41 can be in a range from 20% to 80% of the initial thickness of the first insulating cap layer 170 as formed at the processing step of FIG. 1. For example, the thickness of the conformal sacrificial layer 41 can be in a range from 20 nm to 70 nm, such as 35 to 45 nm, although lesser and greater thicknesses can also be employed.

Each substantially vertical sidewall of the conformal sacrificial layer 41 can have a curvature due to the constant distance from a respective most proximal sidewall of the memory stack structures 55. Specifically, each substantially vertical sidewall of the conformal sacrificial layer 41 can be curved to provide a convex surface that is convex along a horizontal plane and substantially linear along the vertical direction.

The patterning film 44 can be deposited anisotropically employing a directional deposition method that has a predominant direction of deposition (such as the vertical direction). Thus, the patterning film 44 has different thicknesses between horizontal portions and vertical portions. Specifically, the patterning film 44 can have a greater thickness over elevated horizontal portions than on sidewalls or on recessed horizontal surfaces. The patterning film 44 can be deposited employing an anisotropic deposition process such as plasma enhanced chemical vapor deposition or physical vapor deposition (sputtering). In one embodiment, the patterning film 44 can include amorphous carbon or diamond-like carbon (DLC). For example, the patterning film 44 can include Advanced Patterning Film™ by Applied Materials, Inc.

The thickness of the patterning film 44 on the recessed surfaces of the conformal sacrificial layer 41 depends on the width of each recessed surface of the conformal sacrificial layer 41. Thus, the thickness of the patterning film 44 on the recessed surfaces of the conformal sacrificial layer 42 in the backside contact trench regions 110 is greater than the thickness of the patterning film 44 on the recessed surface of the conformal sacrificial layer 41 in the separator trench regions 120. The reduction in the thickness of the patterning film in narrow recessed regions can be in part due to pinching effect that occurs in the separator trench regions 120. In one embodiment, the patterning film 44 can have a variable horizontal thickness in recessed regions that increases with a lateral dimension of a respective recessed region. For example, the thickness of the patterning film 44 can be in a range from 20 nm to 70 nm, such as 35 to 45 nm, over the memory stack structures 55 and on the bottom of the wider backside contact trench regions 110. In contrast, the thickness of the patterning film 44 on the bottom of the narrower separator trench regions 110 can be lower than on the bottom of regions 120, such as from 3 nm to 25 nm, such as 5 to 15 nm.

Figure 18:
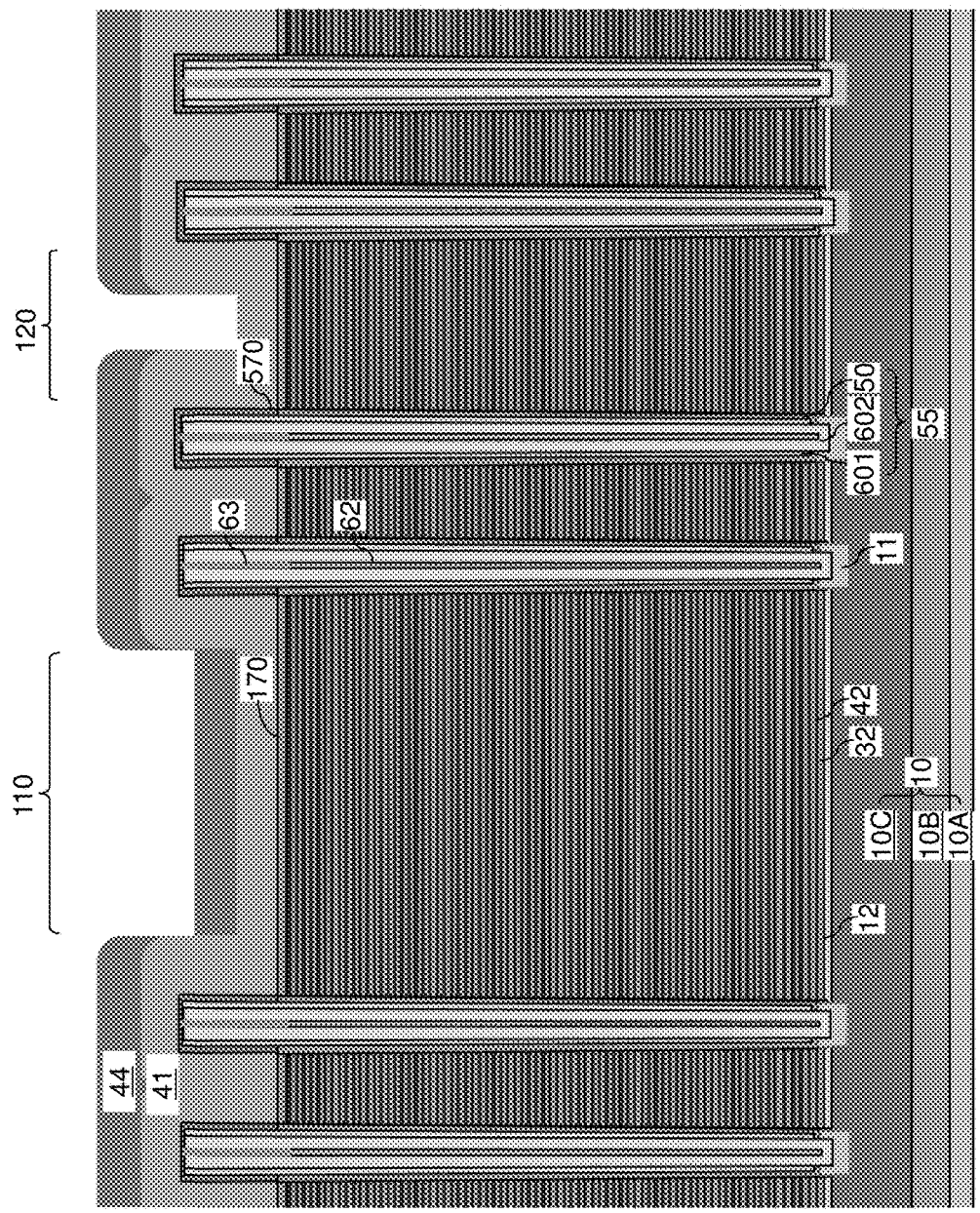
FIG. 18 is a vertical cross-sectional view of the second exemplary structure after trimming of the patterning film according to the second embodiment of the present disclosure.

Referring to FIG. 18, the patterning film 44 can be trimmed to remove portions of the patterning film 44 in the recessed regions within the areas of the separator trench regions 120. In one embodiment, a thickness of patterning film 44 which equals to or greater than the thickness of film 44 on the bottom of region 120, but is less than the thickness of film 44 on the bottom of regions 110 may be isotropically or anisotropically etched. For example, if film 44 thickness is 5 to 15 nm on bottom of region 120, and 35 to 45 nm on bottom of region 110, then between 15 and 30 nm of film 44 may be etched. This completely removes the film 44 from the bottom of region 120, but leaves at least 5 to 30 nm of film 44 on the bottom of region 110 to act as an etch mask. Alternatively, an isotropic dry etch can be performed to isotropically trim the patterning film 44. The duration of the isotropic trimming process can be selected such that the patterning film 44 remains over the topmost surfaces of the conformal sacrificial layer 41 and over the recessed regions within the areas of the backside contract trench regions 110, while the recessed horizontal surfaces of the conformal sacrificial layer 41 are physically exposed within the areas of the separator trench regions 120.

Figure 19:
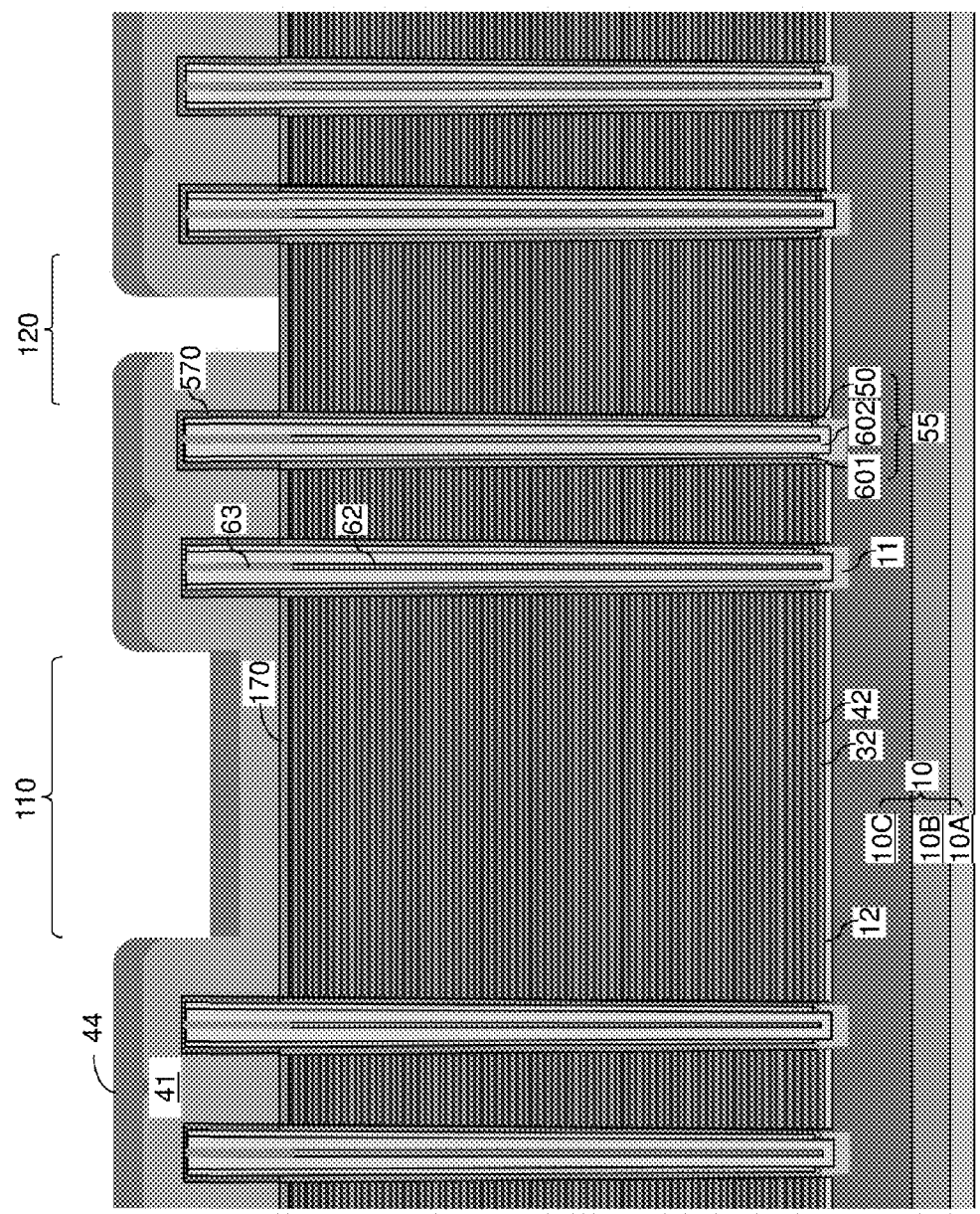
FIG. 19 is a vertical cross-sectional view of the second exemplary structure after anisotropically etching the conformal sacrificial layer to physically expose portions of the top surface of the first insulating cap layer according to the second embodiment of the present disclosure.

Referring to FIG. 19, an anisotropic etch process is performed to etch physically exposed portions of the conformal sacrificial layer 41 employing the patterning film 44 as an etch mask. The etch may be selective to remove layer 41 material selective to film 44 material. Portions of the conformal sacrificial layer 41 are removed from within the separator trench regions 120, while the conformal sacrificial layer 41 is protected by film 44 from the anisotropic etch in the backside contact trench region 110 and in regions in which the top surface of the conformal sacrificial layer 41 protrudes above the memory stack structures 55. Portions of the top surface of the first insulating cap layer 170 are physically exposed within the separator trench regions 120.

Figure 20A:
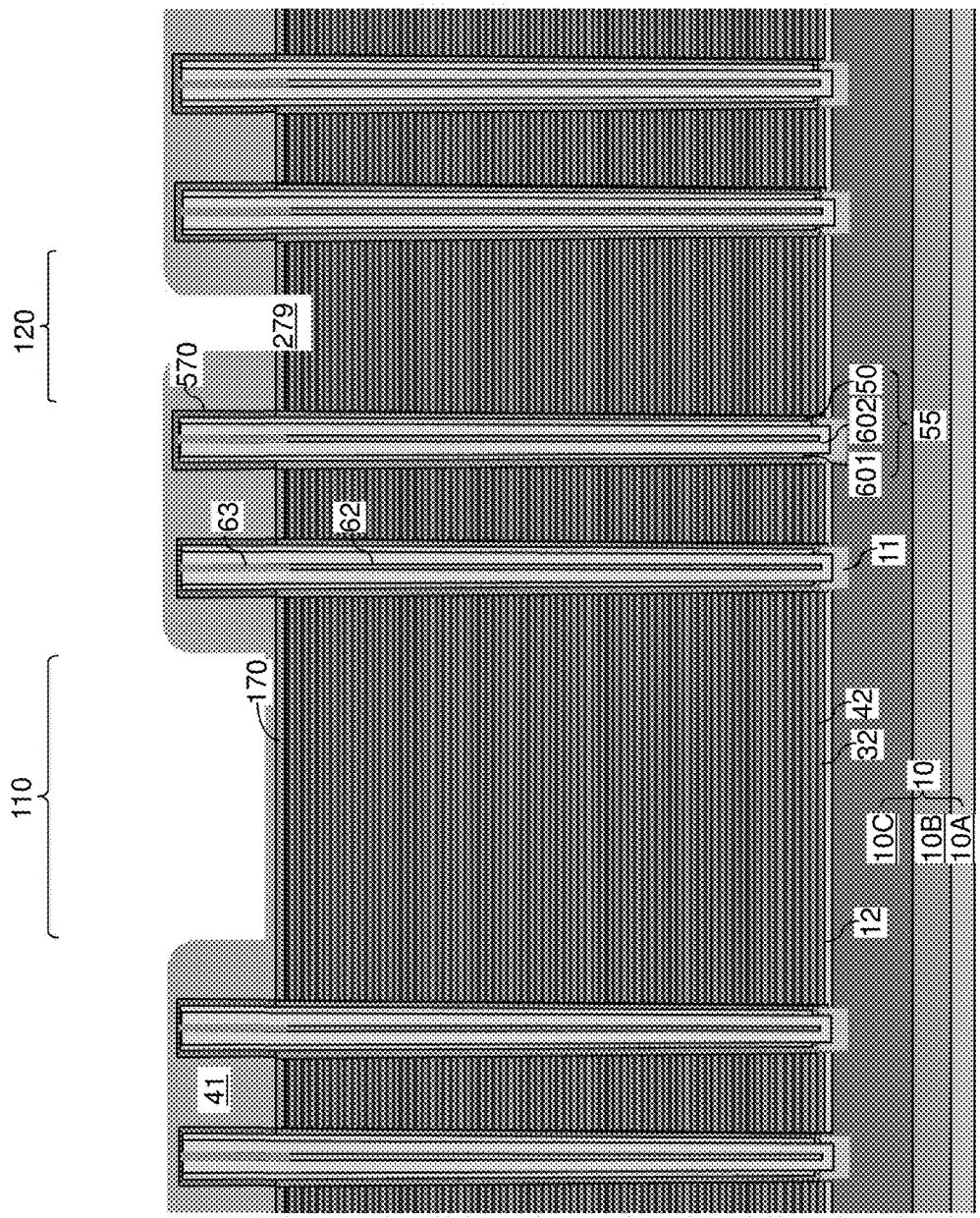
FIG. 20A is a vertical cross-sectional view of the second exemplary structure after formation of separator trenches according to the second embodiment of the present disclosure.

Referring to FIGS. 20A and 20B, separator trenches 279 are formed by recessing regions including physically exposed surfaces of the first insulating cap layer 170. The separator trenches 279 are formed through an upper portion of the alternating stack (32, 42). Thus, each anisotropically etched upper portion of the alternating stack (32, 42) comprises a separator trench 279. Each separator trench 279 extends through a first subset of the spacer material layers (such as sacrificial material layers 42), and does not extend into a second subset of the spacer material layers that underlie the first subset of the spacer material layers. Specifically, the separator trenches 279 extend through the first insulating cap layer 170 and a first subset of sacrificial material layers 42 located at the levels of drain select gate electrodes to be subsequently formed, but does not extend through a second subset of the sacrificial material layers 42 that are located at levels of control gate electrodes to be subsequently formed. Thus, the separator trenches 279 divides the subset of sacrificial material layers 42 to be subsequently replaced with drain select gate electrodes, but does not divide the sacrificial material layers 42 to be replaced with control gate electrodes or source select gate electrodes.

Each separator trench 279 is formed in a region that is not covered by the conformal sacrificial layer 41 or the patterning film 44. The sidewalls of the separator trenches 279 replicate the pattern of the overlying portion of the sidewalls of the conformal sacrificial layer 41. Thus, as shown in FIG. 20B, the separator trench 279 includes non-planar sidewalls (e.g., on the longer, major sides) that contain protruding portions 279A. Portions 279A have convex surfaces that are equidistant from respective most proximate sidewalls of the memory stack structures 55. The non-planar sidewalls of each separator trench 279 can be vertically coincident with sidewalls of the remaining portions of the conformal sacrificial layer 41. Each separator trench 279 can include a plurality of portions 279A that are laterally adjoined together. Each of the portions 279A can be adjoined to at least one respective neighboring non-planar sidewall of the separator trench 279 at a vertical edge 279B. In one embodiment, the non-planar sidewalls on the ends (i.e., minor sides) of the trench 279 can also comprise at least one concave surface 279C that faces the middle of the separator trench 279.

The patterning film 44 can be partly or completely consumed during the anisotropic etch process that forms the separator trenches 279. Layer 41 acts as a hard mask during the etch of the trenches 279. Any remaining portion of the patterning film 44 may be subsequently removed, for example, by ashing.

Figure 21:
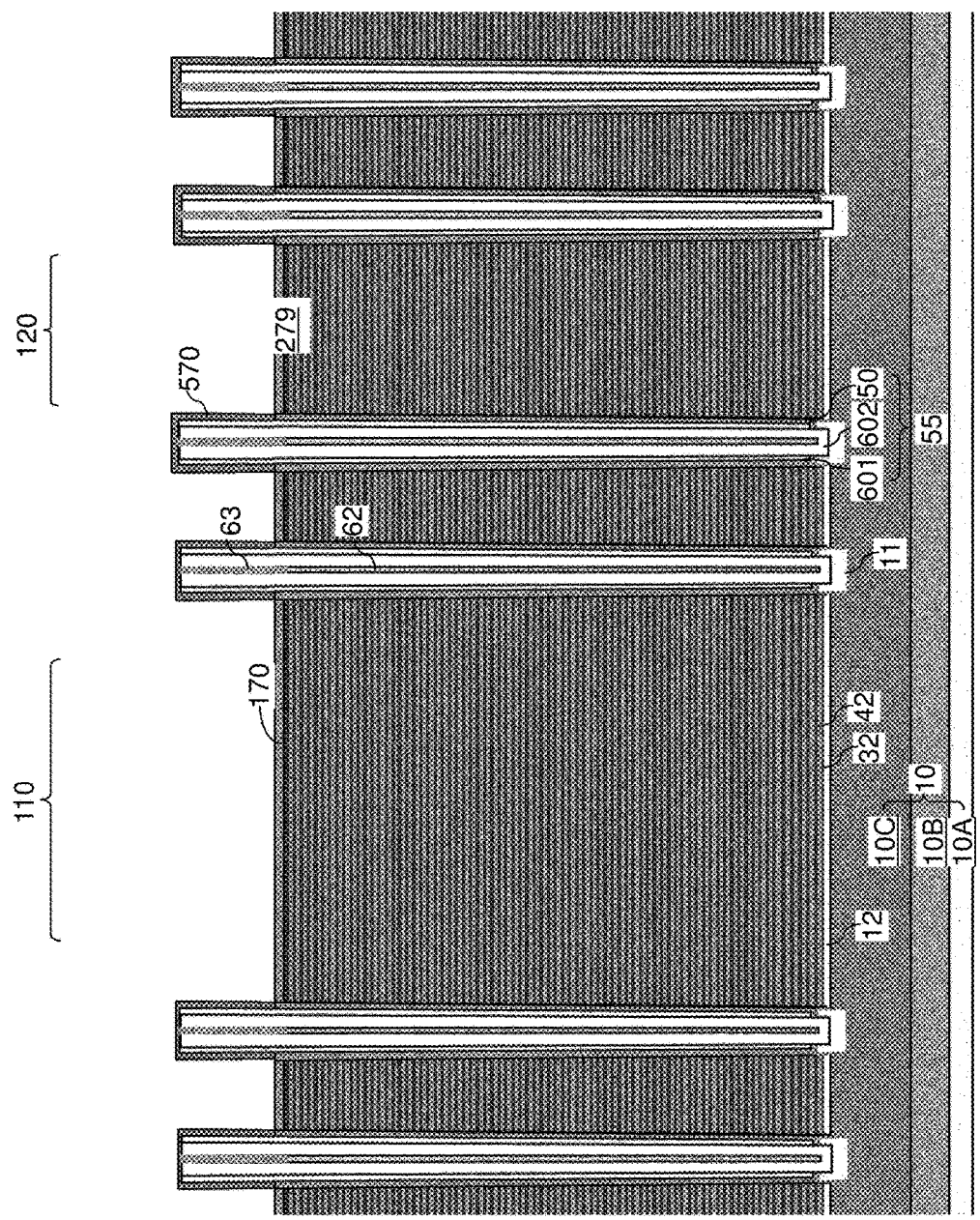
FIG. 21 is a vertical cross-sectional view of the second exemplary structure after removal of the conformal sacrificial layer according to the second embodiment of the present disclosure.

Referring to FIG. 21, the conformal sacrificial layer 41 can be removed selective to the materials of the first insulating cap layer 170, the dielectric cap portions 570, and the alternating stack (32, 42) employing an etch process. For example, if the conformal sacrificial layer 41 is a sacrificial semiconductor material layer that includes amorphous silicon or polysilicon, a wet etch employing tetramethylammonium hydroxide (TMAH) solution or a solution containing trimethyl-2 hydroxyethyl ammonium hydroxide (TMY) can be employed to remove the conformal sacrificial layer 41 without collaterally etching the underlying material layers.

Figure 22:
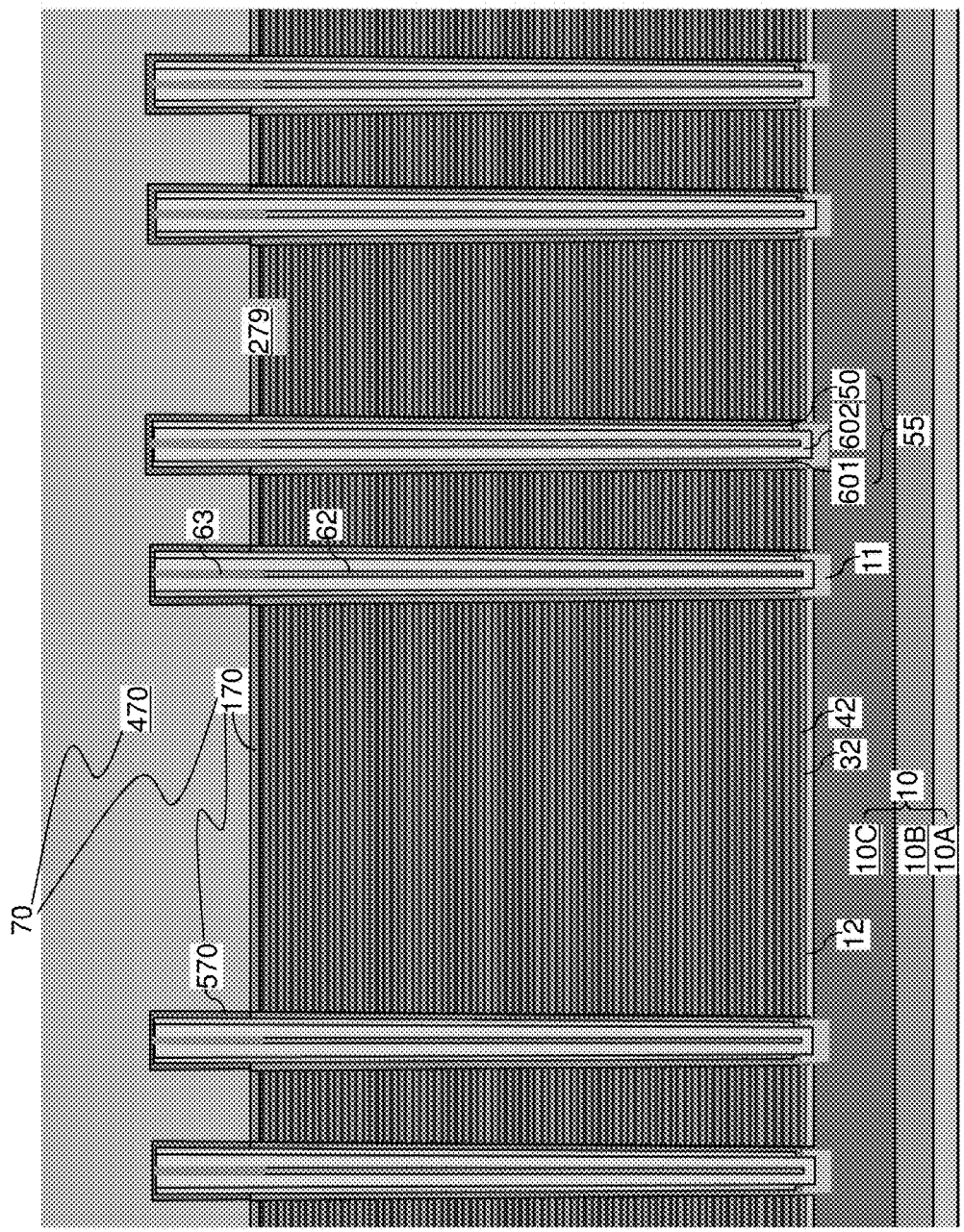
FIG. 22 is a vertical cross-sectional view of the second exemplary structure after deposition and planarization of a second insulating cap layer according to the second embodiment of the present disclosure.

Referring to FIG. 22, a second insulating cap layer 470 can be deposited over the first insulating cap layer 170 and the protruding portions of the memory stack structures 55. The second insulating cap layer 470 includes a dielectric material such as a doped silicate glass or an undoped silicate glass. The dielectric material of the second insulating cap layer 470 can be the same as, or different from, the dielectric material of the first insulating cap layer 170. The second insulating cap layer 470 is a dielectric material layer that fills the separator trenches 279 and overlies the alternating stack (32, 42). The second insulating cap layer 470 can be deposited by chemical vapor deposition or spin coating. The second insulating cap layer 470 can be planarized after deposition, for example, by chemical mechanical planarization, or can be deposited by a self-planarizing process such as spin coating. The first and second insulating cap layers (170, 470) and the dielectric cap portions 570 are herein collectively referred to as insulating cap layers 70.

Subsequently, the processing steps of FIGS. 14, 15, and 16 can be performed to form a three-dimensional memory device, which can be a monolithic three-dimensional memory device.

The various exemplary structures of the present disclosure can include a monolithic three-dimensional memory device, which comprises an alternating stack of insulating layers 32 and electrically conductive layers 46 located over a substrate 10, and a plurality of memory stack structures 55 extending through the alternating stack (32, 42). Each of the memory stack structures 55 comprises a plurality of memory elements (as embodied portions of the charge storage layer 504) located at levels of the electrically conductive layers 46. The monolithic three-dimensional memory device can further comprise a separator trench 279 extending through an upper portion of the alternating stack (32, 42) and including non-planar sidewalls that are equidistant from respective most proximate sidewalls of the memory stack structures 55, and a dielectric material layer (370 or 470) filling the separator trench 279 and overlying the alternating stack (32, 42).

In one embodiment, the non-planar sidewalls comprise protruding portions 279A which have convex surfaces that are adjoined to one another at substantially vertical edges 279B. In one embodiment, a vertical edge of the non-planar sidewalls of the separator trench 279 can be adjoined to a vertical planar surface, which can be a vertical sidewall of the second insulating cap layer 270 that underlies a straight edge SE of the patterned masking layer 277 as illustrated in FIG. 11B. In one embodiment, the protruding portions 279A may contact a concave surface of the portion 80 of the third insulating cap layer 370 that fills the separator trench 279, as illustrated in FIG. 14.

In one embodiment, each of the memory stack structures 55 can comprise a memory film 50 and a semiconductor channel (601, 602) that contacts a drain region 63. In case physically exposed portions of the memory film 50 are removed at the processing steps of FIG. 7, the semiconductor channel (601, 602) protrudes farther upward than the memory film 50 due to removal of an upper portion of the memory film 50.

In one embodiment, a first insulating cap layer 170 can have a top surface that is substantially coplanar with a top surface of each memory film 50. In one embodiment, a second insulating cap layer 270 can overlie the first insulating cap layer 170 and can contact sidewalls of the protruding portions of the semiconductor channels (601, 602) as illustrated in FIG. 13. In one embodiment, a subset of sidewalls of the second insulating cap layer 270 can be vertically coincident with the non-planar sidewalls of the separator trench 279.

In one embodiment, topmost surfaces of the semiconductor channels (601, 602) can be located in a first horizontal plane P1, and the second insulating cap layer 270 can comprise a first top surface located within a second horizontal plane P2 located above the first horizontal plane P1, and a third top surface located within a third horizontal plane P3 located below the first horizontal plane P1 as illustrated in FIG. 12. In one embodiment, a third insulating cap layer 370 having a substantially planar top surface throughout can be provided.

In one embodiment, a plurality of dielectric cap portions 570 contacting a sidewall of a respective underlying semiconductor channel (601, 602) and a top surface of a respective memory film 50 can be provided. A second insulating cap layer 470 can contact a top surface of the first insulating cap layer 170 and sidewalls of the plurality of dielectric cap portions 570.

In one embodiment, the separator trench 279 can extend through a first subset of the electrically conductive layers 46 (e.g., the drain select gate electrodes), and does not extend into a second subset of the electrically conductive layers 46 (e.g., the control gate electrodes and the source select gate electrodes) that underlie the first subset of the electrically conductive layers 46. A backside contact via structure 76 can be provided, which can vertically extend through the entirety of the alternating stack (32, 42) and can contact a source region 61 on the surface of the substrate 10.

In one embodiment, the memory device of the present disclosure can be a monolithic three-dimensional memory device comprising a vertical NAND device located over the substrate 10, and the electrically conductive layers 46 can comprise, or are electrically connected to, a respective word line of the vertical NAND device. The substrate 10 can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

In one embodiment, the memory device of the present disclosure can be a monolithic three-dimensional memory device comprising a vertical NAND device located over the substrate 10, and the electrically conductive layers 46 can comprise, or are electrically connected to, a respective word line of the vertical NAND device. The substrate 10 can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels 60 (e.g., 601, 602). At least one end portion of each of the plurality of semiconductor channels (601, 602) extends substantially perpendicular to a top surface of the substrate 10. In one embodiment, the plurality of semiconductor channels can be connected in a parallel connection to a common horizontal semiconductor channel portion that is a portion of the substrate semiconductor layer 10 between a source region 61 and the epitaxial channel portions 11. The array of monolithic three-dimensional NAND strings can comprise a plurality of charge storage elements (which can be embodied as sections of a charge storage layer 504 that is present within each memory stack structure 55). Each charge storage element can be located adjacent to a respective one of the plurality of semiconductor channels, i.e., adjacent to a respective vertical semiconductor channel (601, 602). The array of monolithic three-dimensional NAND strings can comprise a plurality of control gate electrodes having a strip shape extending substantially parallel to the top surface of the substrate 10. The plurality of control gate electrodes comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    an alternating stack of insulating layers and electrically conductive layers located over a substrate;
    a plurality of memory stack structures extending through the alternating stack;
    a separator trench extending through an upper portion of the alternating stack and including non-planar sidewalls having protruding portions; and
    a dielectric material layer filling the separator trench and overlying the alternating stack;
    wherein the separator trench extends through a first subset of the electrically conductive layers, and does not extend into a second subset of the electrically conductive layers that underlie the first subset of the electrically conductive layers.

2. The monolithic three-dimensional memory device of claim 1, wherein the protruding portions comprise convex surfaces that are adjoined to one another at substantially vertical edges and that are equidistant from respective most proximate sidewalls of the memory stack structures.

3. The monolithic three-dimensional memory device of claim 2, wherein the dielectric material layer comprises concave surfaces that contact the respective convex surfaces.

4. The monolithic three-dimensional memory device of claim 2, wherein the non-planar sidewalls extend in a vertical direction perpendicular to a top surface of the substrate and the convex surfaces protrude in a horizontal direction parallel to the top surface of the substrate.

5. The monolithic three-dimensional memory device of claim 1, wherein each of the memory stack structures comprises a memory film and a semiconductor channel that contacts a drain region, and wherein a plurality of memory elements are located at levels of the electrically conductive layers.

6. The monolithic three-dimensional memory device of claim 5, further comprising a first insulating cap layer having a top surface that is substantially coplanar with a top surface of each memory film, wherein the semiconductor channels protrude farther upward than the memory film.

7. The monolithic three-dimensional memory device of claim 6, further comprising a second insulating cap layer overlying the first insulating cap layer and contacting sidewalls of the protruding portions of the semiconductor channels.

8. The monolithic three-dimensional memory device of claim 7, wherein a subset of sidewalls of the second insulating cap layer is vertically coincident with the non-planar sidewalls of the separator trench.

9. The monolithic three-dimensional memory device of claim 7, wherein:
  topmost surfaces of the semiconductor channels are located in a first horizontal plane; and
  the second insulating cap layer comprises:
    a first top surface located within a second horizontal plane located above the first horizontal plane; and
    a third top surface located within a third horizontal plane located below the first horizontal plane.

10. The monolithic three-dimensional memory device of claim 7, further comprising a third insulating cap layer having a substantially planar top surface throughout.

11. The monolithic three-dimensional memory device of claim 6, further comprising a plurality of dielectric cap portions contacting a sidewall of a respective underlying semiconductor channel and a top surface of a respective memory film.

12. The monolithic three-dimensional memory device of claim 11, further comprising a second insulating cap layer contacting a top surface of the first insulating cap layer and sidewalls of the plurality of dielectric cap portions.

13. The monolithic three-dimensional memory device of claim 5, wherein:
  the monolithic three-dimensional memory device comprises a vertical NAND device;
  the first subset of the electrically conductive layers comprises drain select electrodes of the vertical NAND device; and
  the second subset of the electrically conductive layers comprises control gate electrodes and source select electrodes of the vertical NAND device.

14. The monolithic three-dimensional memory device of claim 13, further comprising a backside contact via structure vertically extending through an entirety of the alternating stack and contacting a source region in the substrate.

15. The monolithic three-dimensional memory device of claim 1, wherein:
  the monolithic three-dimensional memory device comprises a vertical NAND device located over the substrate;
  the electrically conductive layers comprise, or are electrically connected to, a respective word line of the NAND device;
  the substrate comprises a silicon substrate;
  the vertical NAND device comprises an array of monolithic three-dimensional NAND strings over the silicon substrate;
  at least one memory cell in a first device level of the array of monolithic three-dimensional NAND strings is located over another memory cell in a second device level of the array of monolithic three-dimensional NAND strings;
  the silicon substrate contains an integrated circuit comprising a driver circuit for the memory device located thereon; and
  the array of monolithic three-dimensional NAND strings comprises:
    a plurality of semiconductor channels, wherein at least one end portion of each of the plurality of semiconductor channels extends substantially perpendicular to a top surface of the substrate;
    a plurality of charge storage elements, each charge storage element located adjacent to a respective one of the plurality of semiconductor channels; and
    a plurality of control gate electrodes having a strip shape extending substantially parallel to the top surface of the substrate, the plurality of control gate electrodes comprise at least a first control gate electrode located in the first device level and a second control gate electrode located in the second device level.

16. A method of forming a monolithic three-dimensional memory device, comprising:
  forming an alternating stack of insulating layers and spacer material layers over a substrate;
  forming a plurality of memory stack structures through the alternating stack;
  forming a separator trench through an upper portion of the alternating stack, wherein the separator trench includes non-planar sidewalls having protruding portions; and
  forming a dielectric material layer filling the separator trench and overlying the alternating stack;
  wherein the separator trench extends through a first subset of the spacer material layers, and does not extend into a second subset of the spacer material layers that underlie the first subset of the spacer material layers.

17. The method of claim 16, further comprising:
  forming a first insulating cap layer over the alternating stack, wherein the plurality of memory stack structures is formed through the first insulating cap layer; and
  vertically recessing the first insulating cap layer, wherein an upper portion of each memory stack structure protrudes above a recessed top surface of the first insulating cap layer.

18. The method of claim 17, further comprising:
  forming a conformal material layer over the recessed first insulating cap layer and protruding portions of the plurality of memory stack structures;
  forming a masking material layer over the conformal material layer; and
  anisotropically etching physically exposed portions of the conformal material layer and an upper portion of the alternating stack to form the separator trench.

19. The method of claim 18, wherein:
  the conformal material layer is a second insulating cap layer comprising a dielectric material;
  the masking material layer is a patterned photoresist layer; and
  the separator trench is formed in a region that is not covered by the patterned photoresist layer.

20. The method of claim 19, further comprising depositing a third insulating cap layer as the dielectric material layer in the separator trench and over the second insulating cap layer after formation of the separator trench.

21. The method of claim 18, wherein the masking material layer comprises a patterning film, and wherein the patterning film has a variable thickness in recessed regions that increases with a lateral dimension of a respective recessed region.

22. The method of claim 21, further comprising trimming the patterning film prior to anisotropically etching the physically exposed portions of the conformal material layer.

23. The method of claim 21, wherein the conformal material layer is a sacrificial semiconductor material layer.

24. The method of claim 23, further comprising:
removing the sacrificial semiconductor material layer after forming the separator trench; and
depositing a second insulating cap layer as the dielectric material layer in the separator trench and on the first insulating cap layer after removal of the sacrificial semiconductor material layer.

25. The method of claim 24, further comprising forming dielectric cap portions on physically exposed sidewalls of the protruding upper portions of the memory stack structures, wherein the conformal material layer is deposited on the dielectric cap portions.

26. The method of claim 18, wherein the non-planar sidewalls of the separator trench are vertically coincident with sidewalls of remaining portions of the conformal material layer after the physically exposed portions of the conformal material layer are anisotropically etched.

27. The method of claim 18, wherein:
each of the plurality of memory stack structures comprises a memory film and a semiconductor channel; and
the method further comprises removing portions of the memory films that protrude above the recessed top surface of the first insulating cap layer.

28. The method of claim 16, wherein:
the protruding portions comprise convex surfaces that are equidistant from respective most proximate sidewalls of the memory stack structures;
the convex surfaces that are adjoined to one another at substantially vertical edges;
the dielectric material layer comprises concave surfaces that contact the respective convex surfaces; and
the non-planar sidewalls extend in a vertical direction perpendicular to a top surface of the substrate and the convex surfaces protrude in a horizontal direction parallel to the top surface of the substrate.

29. The method of claim 16, further comprising:
forming a contact trench having planar sidewalls which extends through the entire alternating stack;
forming a source region in the substrate through the contact trench;
removing the spacer material layers through the contact trench to form recesses between the insulating layers;
forming electrically conductive layers in the recesses through the contact trench;
forming an insulating spacer in the contact trench; and
forming a contact via structure over the insulating spacer in the contact trench and contacting the source region.

30. The method of claim 29, wherein:
the monolithic three-dimensional memory device comprises a vertical NAND device;
the separator trench extends through a first subset of the electrically conductive layers and does not extend into a second subset of the electrically conductive layers that underlie the first subset of the electrically conductive layers;
the first subset of the electrically conductive layers comprises drain select electrodes of the vertical NAND device; and
the second subset of the electrically conductive layers comprises control gate electrodes and source select electrodes of the vertical NAND device.

31. The method of claim 16, wherein:
the monolithic three-dimensional memory device comprises a vertical NAND device located over the substrate;
the spacer material layers are formed as, or replaced with, electrically conductive layers;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *